United States Patent
Liaw

(10) Patent No.: US 10,879,245 B2
(45) Date of Patent: Dec. 29, 2020

(54) SEMICONDUCTOR DEVICE

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/725,953

(22) Filed: Dec. 23, 2019

(65) Prior Publication Data

US 2020/0144266 A1 May 7, 2020

Related U.S. Application Data

(63) Continuation of application No. 16/122,772, filed on Sep. 5, 2018, now Pat. No. 10,515,967.

(60) Provisional application No. 62/593,103, filed on Nov. 30, 2017.

(51) Int. Cl.
| | |
|---|---|
| *H01L 27/092* | (2006.01) |
| *H01L 29/78* | (2006.01) |
| *H01L 29/423* | (2006.01) |
| *H01L 29/66* | (2006.01) |
| *H01L 21/8238* | (2006.01) |
| *H01L 21/8234* | (2006.01) |
| *H01L 29/165* | (2006.01) |

(52) U.S. Cl.
CPC .. *H01L 27/0924* (2013.01); *H01L 21/823481* (2013.01); *H01L 21/823821* (2013.01); *H01L 21/823864* (2013.01); *H01L 21/823878* (2013.01); *H01L 21/823892* (2013.01); *H01L 29/4232* (2013.01); *H01L 29/66795* (2013.01); *H01L 29/785* (2013.01); *H01L 21/823437* (2013.01); *H01L 21/823828* (2013.01); *H01L 29/165* (2013.01); *H01L 29/66545* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 9,613,953 B2 | 4/2017 | Liaw | |
| 9,805,985 B2 * | 10/2017 | Liaw | ................ H01L 21/76224 |
| 10,056,390 B1 * | 8/2018 | Liaw | ................ H01L 29/4966 |
| 2016/0020210 A1 | 1/2016 | Liaw | |

* cited by examiner

*Primary Examiner* — Hsien Ming Lee
(74) *Attorney, Agent, or Firm* — Maschoff Brennan

(57) ABSTRACT

A semiconductor device includes a germanium-containing fin, a germanium-free fin, and an isolation gate. The germanium-containing fin extends a first length along a first direction within an N-type well region. The germanium-free fin extends a second length along the first direction within a P-type well region bordering the N-type well region. The second length of the germanium-free fin is less than the first length of the germanium-containing fin. The isolation gate extends across the germanium-containing fin along a second direction substantially perpendicular to the first direction, and terminates prior to reaching the germanium-free fin.

20 Claims, 30 Drawing Sheets

SEMICONDUCTOR DEVICE

PRIORITY CLAIM AND CROSS-REFERENCE

This application is a continuation application of U.S. patent application Ser. No. 16/122,772, filed Sep. 5, 2018, now U.S. Pat. No. 10,515,967, issued Dec. 24, 2019, which claims priority to U.S. Provisional Application Ser. No. 62/593,103, filed Nov. 30, 2017, the entire disclosure of each of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
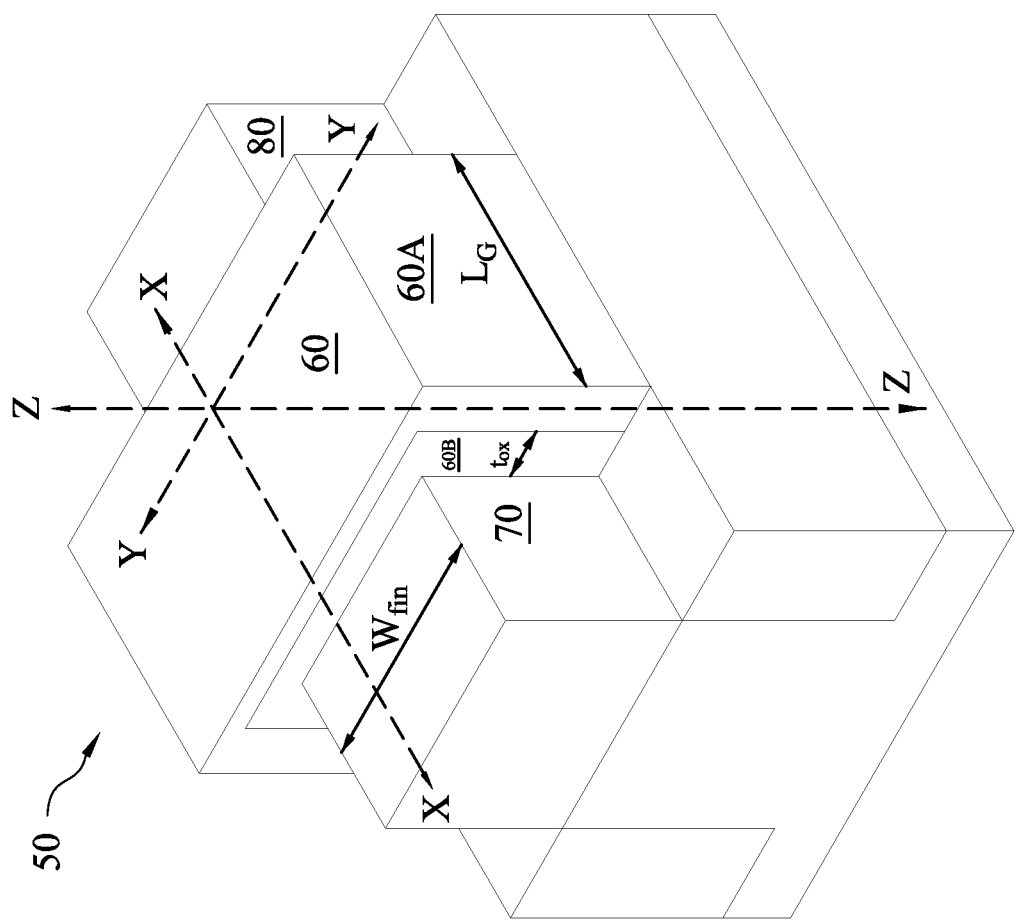
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode 60A and a gate dielectric layer 60B. The gate dielectric layer 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
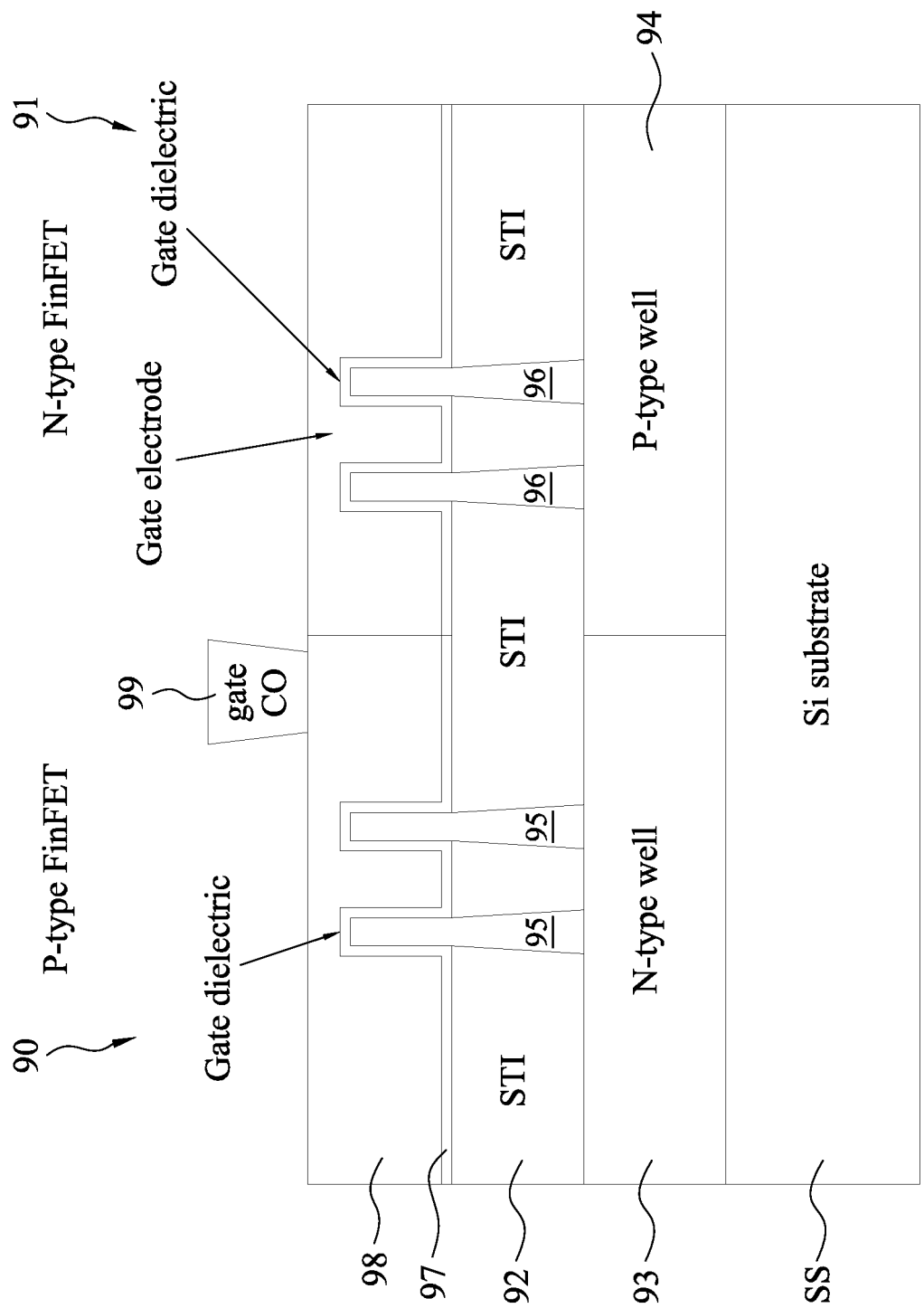
FIG. 2 illustrates a cross-sectional view of FinFET transistors in a CMOS configuration.

FIG. 2 illustrates a diagrammatic cross-sectional side view of FinFET transistors in a CMOS configuration. The CMOS FinFET includes a substrate SS, for example a silicon substrate. An N-type well 93 and a P-type well 94 are formed in the substrate SS. A dielectric isolation structure 92 such as a shallow trench isolation (STI) is formed over the N-type well 93 and the P-type well 94. A P-type FinFET 90 is formed over the N-type well 93, and an N-type FinFET 91 is formed over the P-type well 94. The P-type FinFET 90 includes fins 95 that protrude upwardly out of the STI 92, and the N-type FinFET 91 includes fins 96 that protrude upwardly out of the STI 92. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric 97 is formed over the fins 95-96 and over the STI 92, and a gate electrode 98 is formed over the gate dielectric 97. In some embodiments, the gate dielectric 97 includes a high-k dielectric material, and the gate electrode 98 includes a metal gate electrode, such as aluminum and/or other refractory metals. In some other embodiments, the gate dielectric 97 may include SiON, and the gate electrode 98 may include polysilicon. A gate contact 99 is formed on the gate electrode 98 to provide electrical connectivity to the gate.

FinFET devices offer several advantages over planar Metal-Oxide Semiconductor Field Effect Transistor (MOSFET) devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication methods may still have challenges, such as lack of optimization for forming isolation structures that isolate neighboring circuit cells. For example, one or more dielectric dummy gates are formed in fins to isolate neighboring circuit cells. Fabrication of the dielectric dummy gates includes etching openings in the fins, followed by filling the openings with a dielectric material. However, if the fins are formed of silicon germanium (SiGe) for strain effect enhancement, etching the openings in the fins would break up the fins, which in turn would lead to reduced strain. For another example, one or more isolation gates are formed to wrap around fins and applied with a controlled voltage (e.g., Vdd or V ss) to isolate neighboring circuit cells. Fabrication of the isolation gates is free from etching openings in the fins and thus would prevent the strain loss. However, fabrication of the isolation gates involves an additional gate cut process (e.g. breaking up a continuous isolation gate across the P-type and N-type wells using an etching process) to separate the isolation gate in the N-well from the isolation gate in the P-well, which in turn would frustrate scaling down capability of FinFETs. Therefore, the present disclosure describes one or more FinFET cells that have reduced strain loss in SiGe fins and are fabricated without the additional gate cut process to separate the isolation gate in the N-well from the isolation gate in the P-well, as discussed in more detail below.

Figure 3:
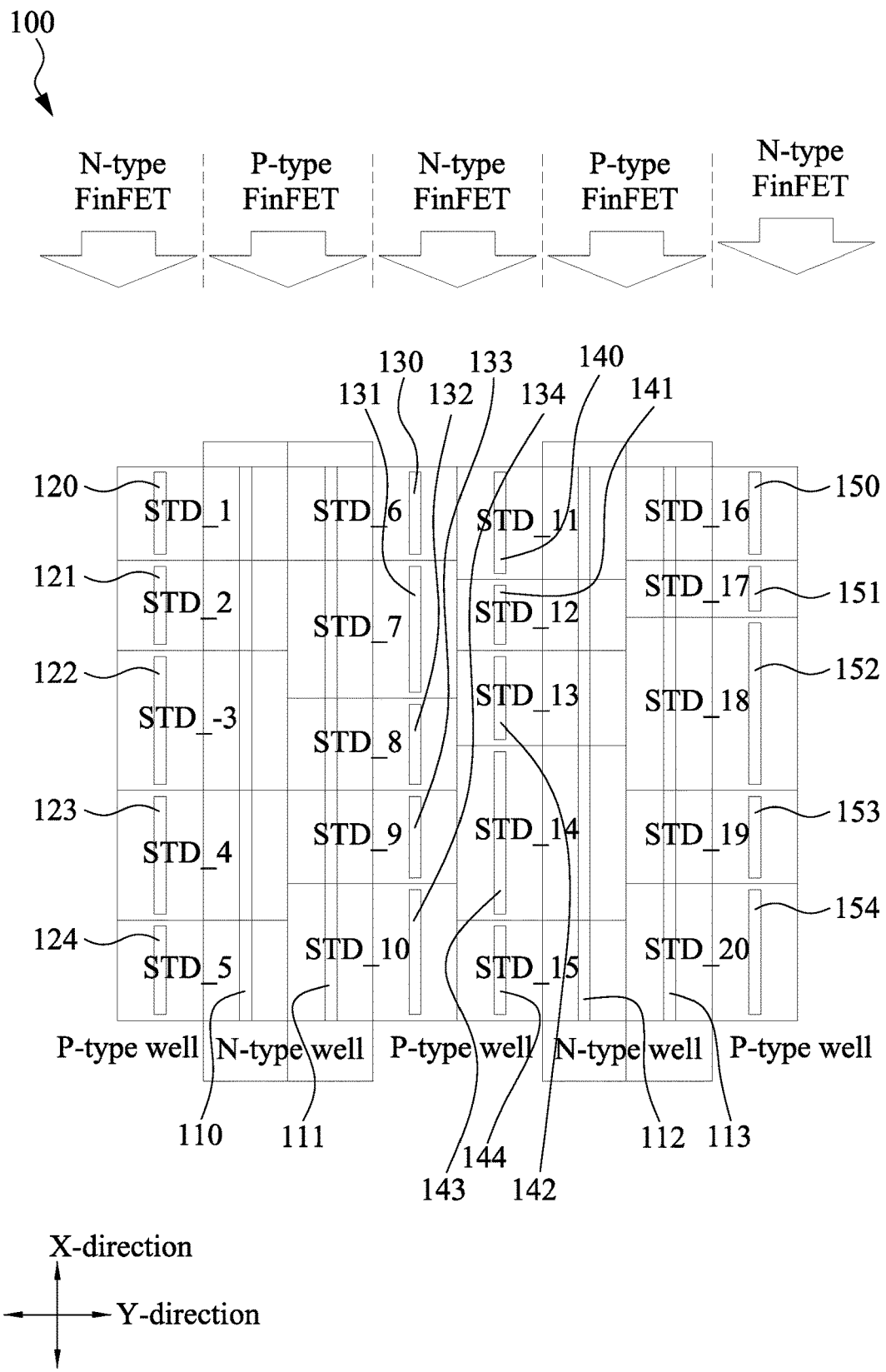
FIG. 3 illustrates a top view of a layout of a standard (STD) cells array in some embodiments of the present disclosure.

FIG. 3 illustrates a top view of a layout of a standard (STD) cells array 100 according to some embodiments of the present disclosure. The standard cells array 100 may include logic circuits or logic devices, and as such it is also referred to as a logic cells array or a logic circuit array. In various embodiments, the logic circuits or devices may include components such as inverters, NAND gates, NOR gates, flip-flops, or combinations thereof.

As illustrated in FIG. 3, the standard cells array 100 includes N-type FinFET transistors with P-type wells, as well as P-type FinFET transistors with N-type wells. The standard cells array 100 also includes a plurality of elongated fins, for example fins 110-113 as parts of the P-type FinFET transistors, as well as fins 120-124, 130-134, 140-144 and 150-154 as parts of the N-type FinFET transistors. The P-type FinFET fins 110-111 are located over the N-type wells, whereas the N-type FinFET fins 120-121, 130-134, 140-144 and 150-154 are located over the P-type wells.

As an example, the standard cells array 100 shown herein includes 20 standard cells STD_1 through STD_20, where the cells STD_1 through STD_5 are arranged into a first column, the cells STD_6 through STD_10 are arranged into a second column adjacent to the first column, the cells STD_11 through STD_15 are arranged into a third column adjacent to the second column, and the cells STD_16 through STD_20 are arranged into a fourth column adjacent to the third column. Of course, FIG. 3 merely illustrates an example of the standard cells array 100, and other embodiments may have different numbers of cells and/or may be arranged differently.

In some embodiments, the P-type FinFET fins 110-113 are made of SiGe (for enhancing the strain effect) and each extend through a respective column of the standard cells (e.g., the fin 110 extending through the standard cells STD_1 through STD_5, and the fin 111 extending through the standard cell STD_6 through STD_10) in the X-direction. Thus, the P-type FinFET fins 110-113 may each be considered "continuous." Stated differently, the P-type FinFET fins 110-113 are each free from being broken up by dielectric dummy gates. As a result, stain loss of the SiGe fins 110-113 resulting from fabrication of dielectric dummy gates can be prevented.

The N-type FinFET fins 120-124, 130-134, 140-144 and 150-154 are made of a non-germanium-containing semiconductor material, for example silicon (Si) with no germanium, which is different from the P-type FinFET fins 110-113. The lengths of the N-type FinFET fins 120-124, 130-134, 140-144 and 150-154 may be the same or different, and the lengths of the P-type FinFET fins 110-113 may be the same or different. The fins 120-124, 130-134, 140-144 and 150-154 does not have the stain loss concern. As a result, the fins 120-124, 130-134, 140-144 and 150-154 can be "discontinuous" or "disjointed with one another" and thus each extend within, not across or through, one of respective standard cells in the X-direction. For example, the N-type FinFET fin 120 extends within the standard cell STD_1, the N-type FinFET fin 121 extends within the standard cell STD_2 and is separated from the fin 120, the N-type FinFET fin 122 extends within the standard cell STD_3 and is separated from the fin 121, the N-type FinFET fin 123 extends within the standard cell STD_4 and is separated from the fin 122, and the N-type FinFET fin 124 extends within the standard cell STD_5 and is separated from the fin 123.

In some embodiments, the N-type FinFET fins 120-124 could have been implemented as a single continuous fin (e.g., similar to the P-type FinFET fin 110) spanning across the standard cells STD_1-STD_5, but according to the various aspects of the present disclosure, that hypothetical single fin is broken up into five discrete and separate fins 120, 121, 122, 123, and 124. The fins 120 and 121 are separated by a gap that spans across the boundary between the standard cells STD_1 and STD_2 (in the X-direction). The fins 121 and 122 are separated by a gap that spans across the boundary between the standard cells STD_2 and STD_3 (in the X-direction). The fins 122 and 123 are separated by a gap that spans across the boundary between the standard cells STD_3 and STD_4 (in the X-direction). The fins 123 and 124 are separated by a gap that spans across the boundary between the standard cells STD_4 and STD_5 (in the X-direction). Due at least in part to these gaps, it may be said that the N-type FinFETs in the standard cells have discontinuous or broken-up fins.

As discussed above with reference to FIG. 1, the fins 110-113, 120-124, 130-134, 140-144 and 150-154 each include a channel region as well as source/drain regions located next to (e.g., on opposite sides of) the channel region. The FinFET transistors of the STD cells array 100 each include a respective gate that wraps around a respective one of the fins 110-113, 120-124, 130-134, 140-144 and 150-154 in the manner described above with reference to FIG. 1. As discussed previously, the P-type FinFET (PMOSFET) fins 110-113 are comprised of a silicon germanium (SiGe) material (for enhancing the strain effect), but the N-type FinFET (NMOSFET) fins 120-124, 130-134, 140-144 and 150-154 are comprised of a non-germanium-containing semiconductor material, for example silicon (Si). Therefore, in some embodiments, the PMOSFET has a SiGe channel, but the NMOSFET has a Si channel. In some embodiments, a channel fin width of the NMOSFET is narrower than a channel fin width of the PMOSFET. In some embodiments, the source/drain regions of the NMOSFET include an epitaxy material such as SiP, SiC, SiPC, SiAs, Si, or combinations thereof. In some embodiments, the PMOSFET's source/drain region has a wider width than the channel region.

In some embodiments, for the PMOSFET, the germanium atomic concentration in the SiGe channel region is less than the germanium atomic concentration in the source/drain region. For example, the germanium atomic concentration in the SiGe channel region may be in a range between about 10% and about 40%, and the germanium atomic concentration in the source/drain region is in a range between about 41% and about 80%. If the germanium atomic concentration in the SiGe channel region is less than about 10%, the carrier mobility in the SiGe channel region may be unsatisfactory for the PMOSFET. If the germanium atomic concentration is greater than about 40%, the reliability may be degraded because the increased germanium atomic concentration would lead to oxidation of germanium, which in turn results in an adverse impact on the gate dielectric breakdown voltage. If the germanium atomic concentration in the source/drain region is less than about 41%, the source/drain region may have less germanium atomic concentration than that of the channel region, which in turn will results in reduced strain in the channel region. If the germanium atomic concentration in the source/drain region is greater than about 80%, the p-type dopant (e.g., boron) concentration may be unsatisfactory for the PMOSFET.

As discussed above, each of the P-type FinFET fins 110-113 of the standard cells array 100 is continuous for preventing strain loss. For example, the P-type FinFET fins 110-113 each extend across at least three abutted cells (e.g., cells abutted in the X-direction). In the embodiments shown in FIG. 3, the P-type FinFET fin 110 extends across five abutted standard cells STD_1-STD-5, the P-type FinFET fin 111 extends across five abutted standard cells STD_6-STD_10, the P-type FinFET fin 112 extends across five abutted standard cells STD_11-STD_15, and the P-type FinFET fin 113 extends across five abutted standard cells STD_16-STD_20. On the contrary, the N-type FinFET fins 120-124, 130-134, 140-144 and 150-154 of the standard cells array 100 are "discontinuous" because of the relaxed strain loss concern. For example, the N-type FinFET fins 120-124 respectively extend within abutted cells STD_1-STD_5, the N-type FinFET fins 130-134 respectively extend within abutted cells STD_6-STD_10, the N-type FinFET fins 141-144 respectively extend within abutted cells STD_11-STD_15, and the N-type FinFET fins 150-154 respectively extend within abutted cells STD_16-STD_20.

Figure 4A:
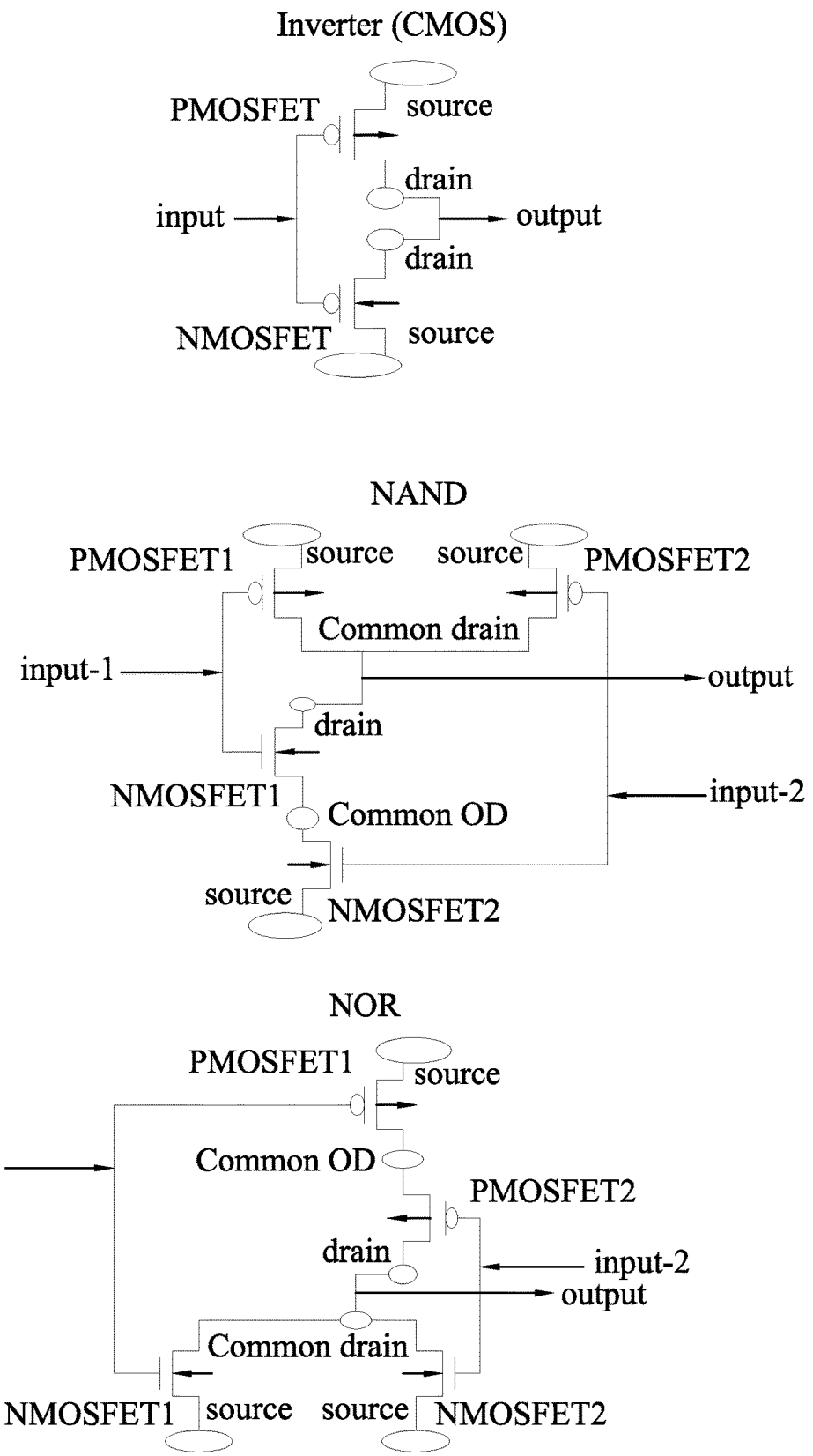
FIG. 4A illustrates circuit schematics of various logic gates according to some embodiments of the present disclosure.
Figure 4B:
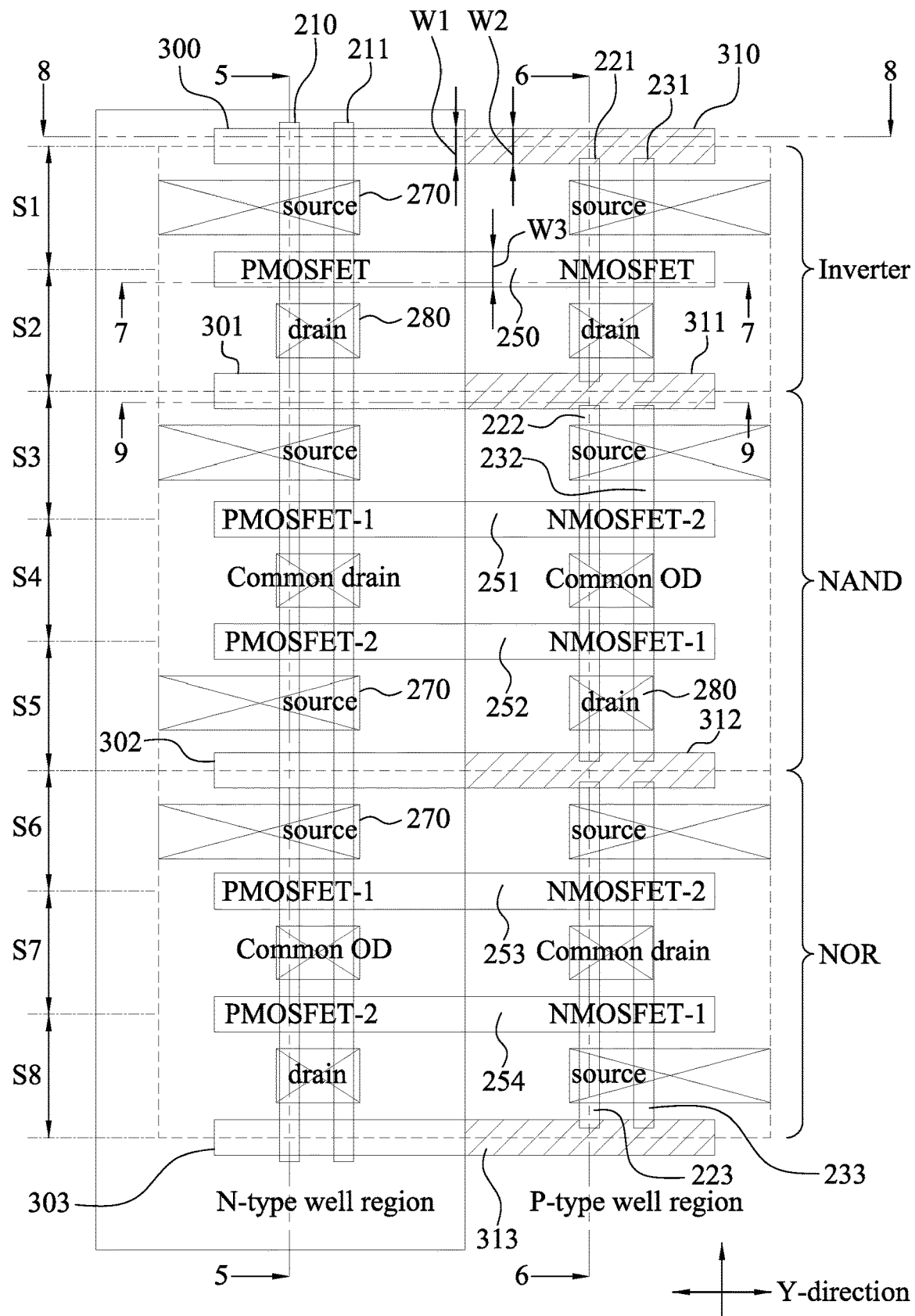
FIG. 4B illustrates a top view of a layout corresponding to the logic gates shown in FIG. 4A according to some embodiments of the present disclosure.

FIGS. 4A and 4B illustrate exemplary standard cells according to some embodiments of the present disclosure. In more detail, FIG. 4A illustrates the circuit schematics of some logic gates built using CMOS FinFETs, and FIG. 4B illustrates a top view of a layout corresponding to these logic gates shown in FIG. 4A. It is understood that the top view of the layout shown in FIG. 4B may correspond to one or more of the STD cells shown in FIG. 3.

As examples, the logic gates shown in FIG. 4A includes an inverter gate, a NAND gate, and a NOR gate. The inverter gate, the NAND gate, and the NOR gate each include one or more N-type MOSFETs (NMOSFET) and one or more P-type MOSFETs (PMOSFETs). The particular type of logic gate is determined by coupling the gate, source, and drain of the NMOSFETs and PMOSFETs in a specific configuration as shown in FIGS. 4A-4B. The input terminal and output terminal of each logic gate is also labeled in FIG. 4A as such.

The layout of FIG. 4B illustrates PMOSFETs with an N-type well region and NMOSFETs with a P-type well region. A plurality of fins 210-211, 221-223, and 231-233 extend in an elongated manner in the X-direction. The fins 210-211 are parts of the PMOSFETs, and the fins 221-223 and 231-233 are parts of the NMOSFETs. The PMOSFET fins 210-211 are located within the N-type well region, whereas the NMOSFET fins 221-223 and 231-233 are located within the P-type well region.

As discussed above with reference to FIG. 1, the fins 210-211, 221-223 and 231-233 each include a channel region as well as source/drain regions located next to (e.g., on opposite sides of) the channel region. In the present embodiments, the PMOSFET fins 210-211 are formed of a silicon germanium (SiGe) material (for strain effect enhancement), but the NMOSFET fins 221-223 and 231-233 are formed of a non-germanium-containing semiconductor material, for example Si. The PMOSFET fins 210-211 are each continuous to prevent strain loss. For example, the SiGe fins 210-211 each extend across three or more abutted cells (abutted in the X-direction) such as the inverter cell, the NAND cell, and the NOR cell. On the contrary, the NMOSFET fins 221, 222 and 223 extend discontinuously in the X-direction, and the NMOSFET fins 231, 232 and 233 extend discontinuously in the X-direction. In other words, the NMOSFET fins 221, 222 and 223 are separated and aligned in the X-direction, the NMOSFET fins 231, 232 and 233 are separated and aligned in the X-direction as well. The NMOSFET fins 221 and 231 extend within the inverter cell, the NNMOSFET fins 222 and 232 extend within the NAND cell, and the NMOSFET fins 223 and 233 extend within the NOR cell.

In each of the circuit cells (e.g., the inverter, NAND, or NOR), gate electrodes 250-254 extend into both the N-type well region and the P-type well region in the Y-direction. The portions of the gate electrodes 250-254 located within the N-type well region form the gates of PMOSFETs, and the portions of the gate electrodes 250-254 located within the P-type well region forms the gates of the NMOSFETs. The gate electrode 250 wraps around the fins 210-211 and 221-231 in the manner described above with reference to FIG. 1. For example, the gate electrode 250 in the N-type well region wraps around the fins 210 and 211, and the gate electrode 250 in the P-type well region wraps around the fins 221 and 231. Similarly, the gate electrode 251 wraps around the fins 210 and 211 in the N-type well region and fins 222 and 232 in the P-type well region, the gate electrode 252 wraps around the fins 210 and 211 in the N-type well region and fins 222 and 232 in the P-type well region, the gate electrode 253 wraps around the fins 210 and 211 in the N-type well region and fins 223 and 233 in the P-type well region, and the gate electrode 254 wraps around the fins 210 and 211 in the N-type well region and fins 223 and 233 in the P-type well region.

The source/drain contacts (providing electrical connectivity to the source/drains of the FinFETs) are also illustrated in the layout of FIG. 4B, some examples of which are labeled herein as source contacts 270 and drain contacts 280. In some embodiments, a contact 280 acts as a common drain, and a contact 280 act as a common node (common OD as annotated in the layout of FIG. 4B). It is understood that silicide layers may be formed on the source/drain regions, and the source/drain contacts may be formed on the silicide layers.

According to the various aspects of the present disclosure, a plurality of PMOSFET isolation transistors are implemented between abutted circuit cells to provide electrical isolation between the abutted circuit cells. In more detail, the PMOSFET isolation transistors respectively include isolation gates 300, 301, 302 and 303 in the N-type well region that are each located on a border between two abutted circuit cells, for example on the border between the inverter cell and the NAND cell, on the border between the NAND cell and the NOR cell, etc. The isolation gates 300-303 of the PMOSFET isolation transistors are each electrically tied to a voltage source Vdd.

The isolation gates 300-303 of the PMOSFET isolation transistors wrap around the fins 210 and 211 having the SiGe channels. Each of the isolation gates 300-303 includes, for example, polysilicon. The source region of the PMOSFET isolation transistor is common with the P-type source/drain region of one of the PMOSFET transistors from the standard cells, and the drain region of the PMOSFET isolation transistor is common with the P-type source/drain region of another one of the PMOSFET transistors from the standard cells.

Due at least in part to the locations of the isolation gates 300-303 (e.g., the isolation gates 300-303 being located on the circuit cell borders) and their electrical configuration (e.g., the isolation gates 300-303 being electrically tied to Vdd), the PMOSFET isolation transistors provide electrical isolation between the adjacent circuit cells for the PMOSFET, for example the isolation gates 301 provide electrical isolation between the inverter cell and the NAND cell, or the isolation gates 302 provide electrical isolation between the NAND cell and the NOR cell.

According to the various aspects of the present disclosure, a plurality of dielectric dummy gates 310, 311, 312 and 313 are located within the P-type well region between abutted circuit cells to provide electrical isolation between the abutted circuit cells. In this context, the dummy gate is a gate that does not act as a gate of a transistor. The dielectric dummy gates 310-313 are each located on a border between two abutted circuit cells, for example the dielectric dummy gates 311 on the border between the inverter cell and the NAND cell, the dielectric dummy gates 312 on the border between the NAND cell and the NOR cell, etc. The dielectric dummy gates 310-313 comprise one or more dielectric materials. Example dielectric materials of the dummy gates 310-313 include, but are not limited to, silicon-based dielectric materials, such as $SiO_2$, SiON, $Si_3N_4$, SiOCN, the like, or combinations thereof.

The NMOSFET fins 221-223 and 231-233 terminate at corresponding dielectric dummy gates. For example, upper ends of the NMOSFET fins 221 and 231 overlap with the dielectric dummy gate 310, lower ends of the NMOSFET fins 221 and 231 overlap with an upper region of the dielectric dummy gate 311, upper ends of the NMOSFET fins 222 and 232 overlap with a lower region of the dielectric dummy gate 311, lower ends of the NMOSFET fins 222 and 232 overlap with an upper region of the dielectric dummy gate 312, upper ends of the NMOSFET fins 223 and 233 overlap with a lower region of the dielectric dummy gate 312, and lower ends of the NMOSFET fins 223 and 233 overlap with the dielectric dummy gate 313.

Due at least in part to the locations of the dielectric dummy gates 310-313 (e.g., the dielectric dummy gates 310-313 being located on the circuit cell borders and overlapping with ends of the NMOSFET fins), the dielectric dummy gates 310-313 provide electrical isolation between the abutted circuit cells, for example the dielectric dummy gates 311 between the inverter cell and the NAND cell, or the dielectric dummy gates 312 between the NAND cell and the NOR cell.

Because the gates 310-313 in the P-type well region are dielectric, rather than conductive, a gate cut process to separate the isolation gate in the N-type well region from the isolation gate in the P-type well region as discussed previously can be omitted, which in turn benefits the scaling down process of FinFETs. Because the gate cut process is omitted, fabrication of the dielectric dummy gates 310-313, which will be discussed in more detail below, may result in that the dielectric dummy gates 310-313 abut (or are in contact with) the respective isolation gates 300-303.

Figure 8:
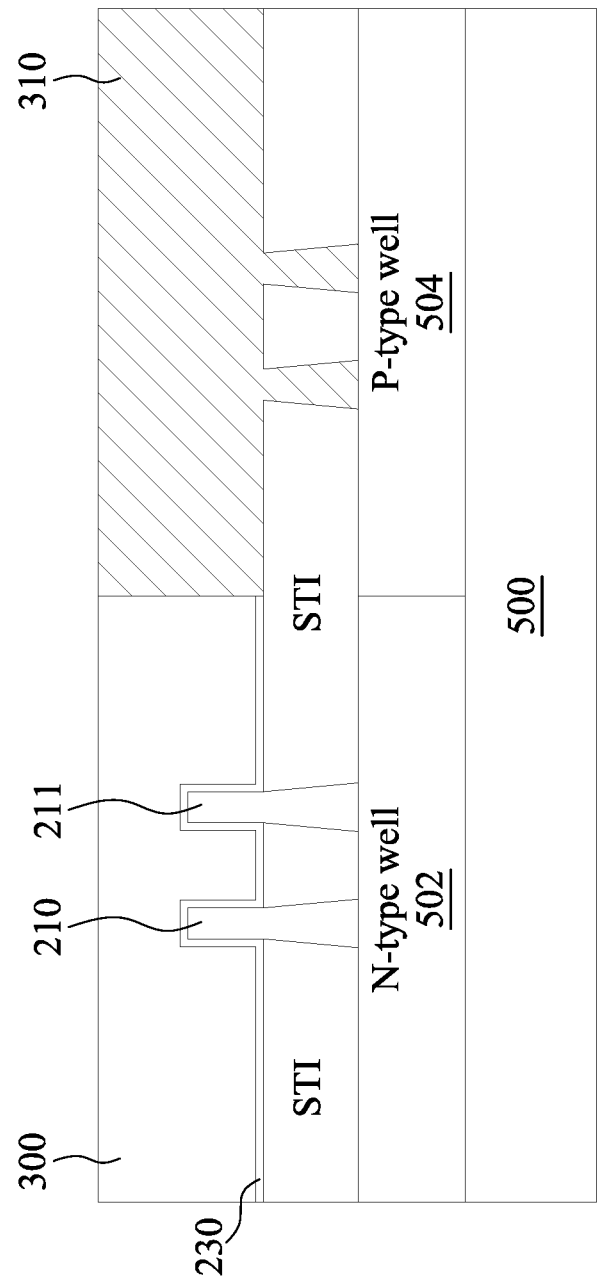

For example, the isolation gate 300 and the dielectric dummy gate 310 are aligned in the Y-direction and in contact with (or abut) each other, as illustrated in FIG. 8. In certain embodiments, the isolation gate 300 and the dielectric dummy gate 310 extend in an elongated manner in the Y-direction and share the same edge on a border between the N-type well region and the P-type well region. Similarly, the isolation gate 301 and the dielectric dummy gate 311 are aligned in the Y-direction and in contact with each other, the isolation gate 302 and the dielectric dummy gate 312 are aligned in the Y-direction and in contact with each other, and the isolation gate 303 and the dielectric dummy gate 313 are aligned in the Y-direction and in contact with each other.

In some embodiments, a width W1 of the isolation gate 300 (measured in the X-direction) is substantially the same as a width W2 of the dielectric dummy gate 310. For example, the widths of the isolation gate 300 and the dielectric dummy gate 310 are in a range from about 3 nm to about 30 nm. The range is selected such that the isolation gate 300 and the dielectric dummy gate 310 have substantially the same size as the functional gates electrodes 250-254, so as to facilitate the patterning process for forming these gate lines. In other words, widths W3 of the gate electrodes 250-254 are in a range from about 3 nm to about 30 nm as well. If the widths of the gate electrodes 250-254, the isolation gate 300, and the dielectric dummy gate 310 are less than about 3 nm, the yield may be degraded due to increased difficulty of photolithography techniques for fabricating these gates. If the widths of the gate electrodes 250-254, the isolation gate 300, and the dielectric dummy gate 310 are greater than about 30 nm, the transistors cannot be scaled down to a satisfactory extent.

Because the isolation gate 300 and the dielectric dummy gate 310 have substantially the same width, the isolation gate 300 has a sidewall substantially coplanar with a sidewall of the dielectric dummy gate 310. Similarly, the isolation gate 301 and the dielectric dummy gate 311 have substantially the same width and thus have substantially coplanar sidewalls, the isolation gate 302 and the dielectric dummy gate 312 have substantially the same width and thus have substantially coplanar sidewalls, and the isolation gate 303 and the dielectric dummy gate 313 have substantially the same width and thus have substantially coplanar sidewalls. In some embodiments, the width of each of the isolation gates 300-303 is substantially the same as the width of each of the gate electrodes 250-254, and the width of each of the dielectric dummy gates 310-313 is substantially the same as the width of each of the gate electrodes 250-254 as well.

In some embodiments, a total of a length of the isolation gate 300 (measured in the Y-direction) and a length of the dielectric dummy gate 310 is substantially the same as the length of each of the gate electrodes 250-254. Moreover, in some embodiments, a total length of the isolation gate 300 and dielectric dummy gate 310 is substantially the same as a total length of the isolation gate 301 and dielectric dummy gate 311, the total length of the isolation gate 301 and dielectric dummy gate 311 is substantially the same as a total length of the isolation gate 302 and dielectric dummy gate 312, the total length of the isolation gate 302 and dielectric dummy gate 312 is substantially the same as a total length of the isolation gate 303 and dielectric dummy gate 313. Because of the lengths and widths of the isolation gates, the dielectric dummy gates and the gate electrodes as discussed above, a top view profile of each of the gate electrodes 250-254, a top view profile of a combined structure of the isolation structure 300 and the dielectric dummy structure 310, a top view profile of a combined structure of the isolation structure 301 and the dielectric dummy structure 311, a top view profile of a combined structure of the isolation structure 302 and the dielectric dummy structure 312, and a top view profile of a combined structure of the isolation structure 303 and the dielectric dummy structure 313 are substantially the same.

In some embodiments, all of the isolation gates 300-303 and the gate electrodes 250-254 are spaced from each other by substantially the same spacing (or center-to-center distance) S1, S2, S3, S4, S5, S6, S7 and S8 in the X-direction. For example, the spacing S1 between the isolation gate 300 and the gate electrode 250, the spacing S2 between the gate electrode 250 and the isolation gate 301, the spacing S3 between the isolation gate 301 and the gate electrode 251, the spacing S4 between the gate electrodes 251 and 252, the spacing S5 between the gate electrode 252 and the isolation gate 302, the spacing S6 between the isolation gate 302 and the gate electrode 253, the spacing S7 between the gate electrodes 253 and 254, and the spacing S8 between the gate electrode 254 and the isolation gate 303 are substantially the same. The spacing S1-S8 is in a range from about 15 nm to about 100 nm in some embodiments. The spacing S1-S8 is also referred to as the contacted poly pitch (CPP) (i.e., the minimum center-to-center space between gates of adjacent transistors). If the spacing S1-S8 is less than about 15 nm, the yield may be degraded because of increased difficulty of photolithography techniques for forming the source contacts 270 and drain contacts 280. If the spacing S1-S8 is greater than about 100 nm, the transistor density would be unsatisfactory.

In some embodiments, all of the dielectric dummy gates 310-313 and the gate electrodes 250-254 are spaced from each other by substantially the same spacing S1-S8 as well. For example, the spacing S1 between the dielectric dummy gate 310 and the gate electrode 250, the spacing S2 between the gate electrode 250 and the dielectric dummy gate 311, the spacing S3 between the dielectric dummy gate 311 and the gate electrode 251, the spacing S4 between the gate electrodes 251 and 252, the spacing S5 between the gate electrode 252 and the dielectric dummy gate 312, the spacing S6 between the dielectric dummy gate 312 and the gate electrode 253, the spacing S7 between the gate electrodes 253 and 254, and the spacing S8 between the gate electrode 254 and the dielectric dummy gate 313 are substantially the same. In some other embodiments, at least two of the Spacings S1-S8 are different. In some embodiments, in the layout view (or top view), sidewalls of the isolation gate 300, 301, 302 and 303 are substantially flush with sidewalls of the dielectric dummy gate 310, 311, 312 and 313, respectively.

Figure 5:
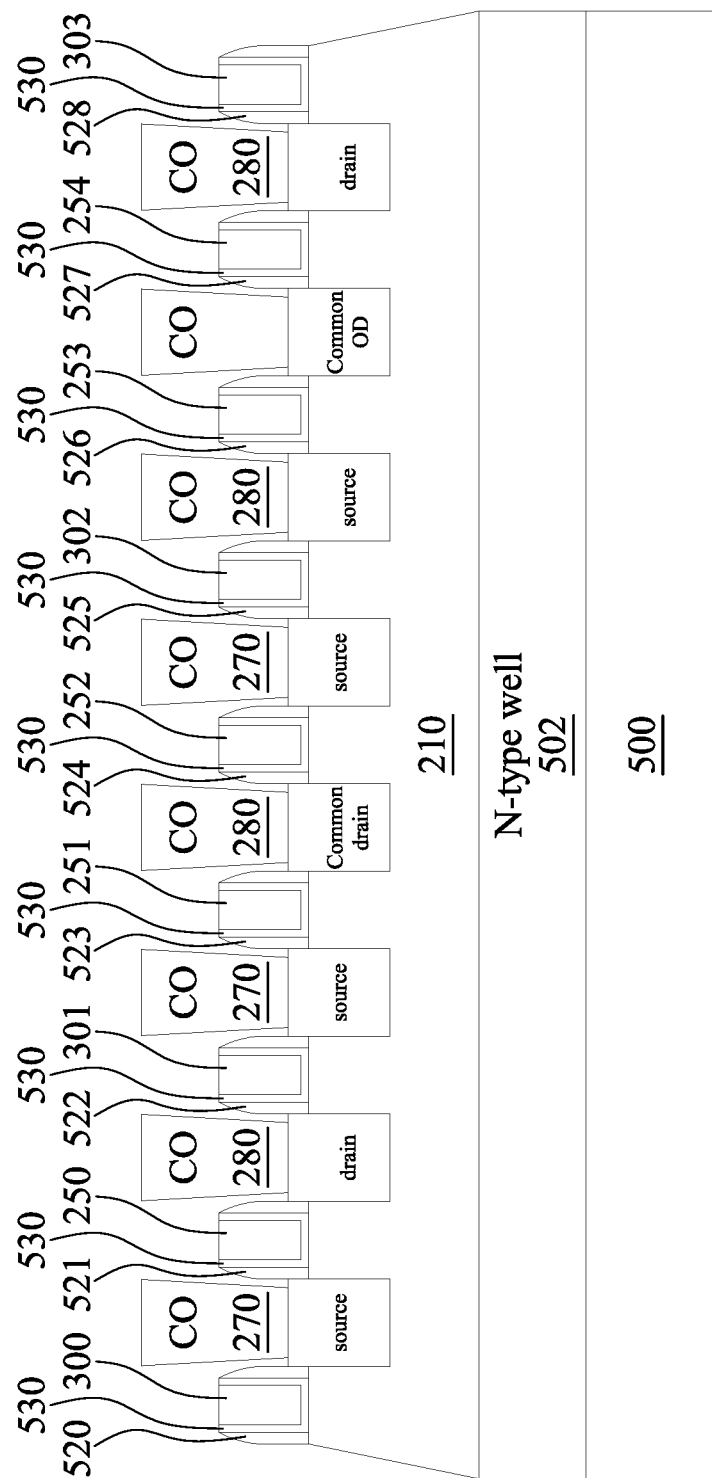
FIGS. 5-8 illustrate different cross-sectional views of a semiconductor device having the layout as illustrated in FIG. 4B.
Figure 6:
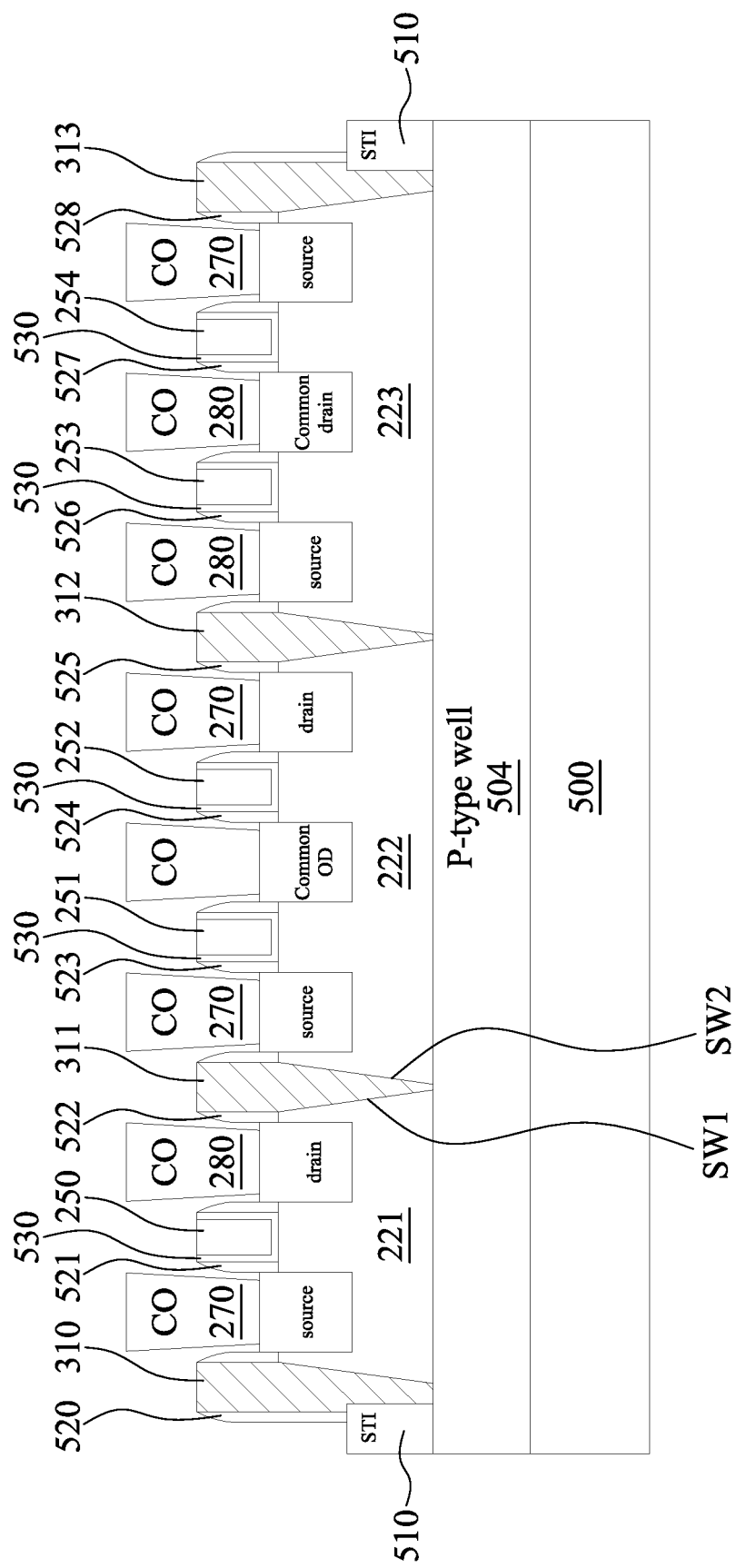
Figure 7:
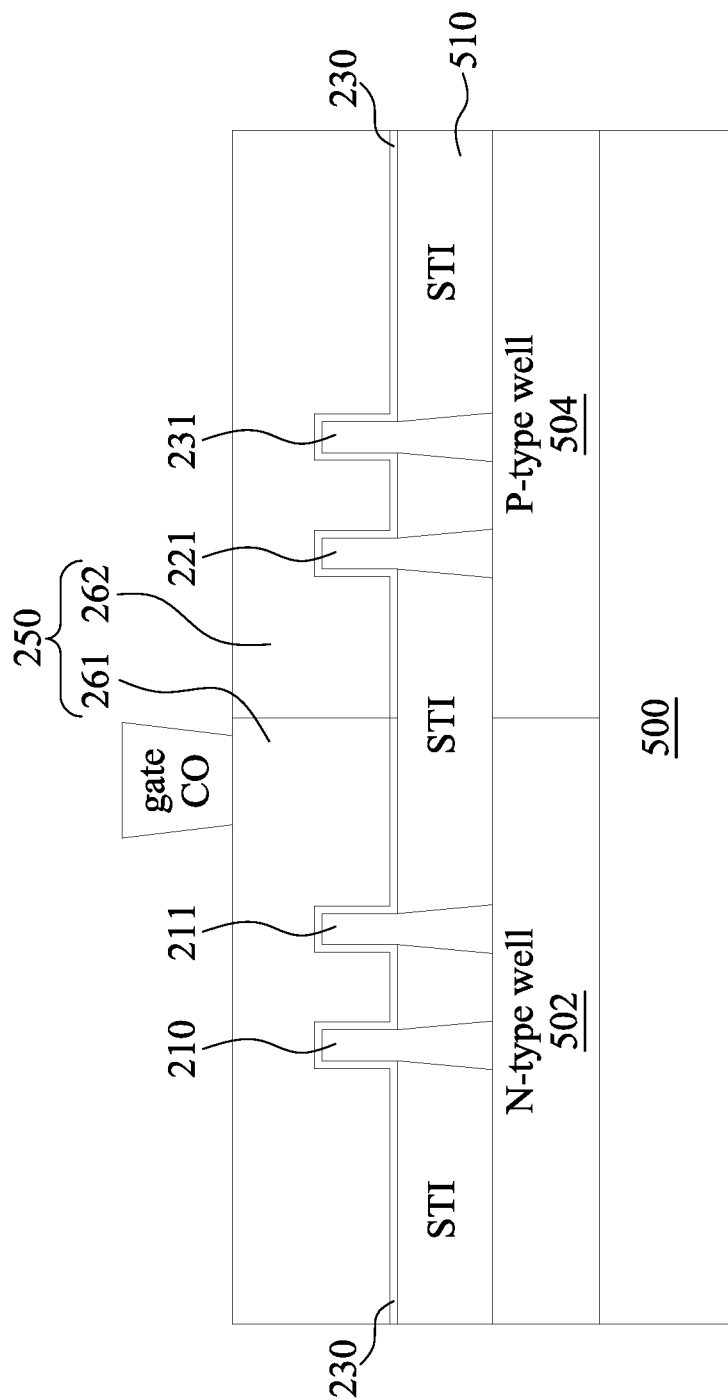

FIGS. 5-8 illustrate cross-sectional views of a semiconductor device having the layout as illustrated in FIG. 4B. The cross-sectional view in FIG. 5 is taken along line 5-5 shown in FIG. 4B, the cross-sectional view in FIG. 6 is taken along line 6-6 shown in FIG. 4B, the cross-sectional view in FIG. 7 is taken along line 7-7 shown in FIG. 4B, and the cross-sectional view in FIG. 8 is taken along line 8-8 shown in FIG. 4B. The configuration of the semiconductor device is described herein with respect to FIGS. 5-8.

As illustrated in FIG. 5, transistors are formed over a substrate 500. The substrate 500 comprises, in some embodiments, a silicon substrate. The substrate 500 comprises, in some embodiments, silicon germanium (SiGe), gallium arsenic, P-type doped Si, N-type doped Si, or other suitable semiconductor materials. For example, semiconductor materials including group III, group IV, and group V elements are within the scope of various embodiments. In some embodiments, the substrate 500 further includes one or more other features, such as various doped regions, a buried layer, and/or an epitaxy (epi) layer. In some embodiments, the substrate 500 comprises a semiconductor on insulator, such as silicon on insulator (SOI). In some embodiments, the substrate 500 includes a doped epi layer, a gradient semiconductor layer, and/or a semiconductor layer overlying another semiconductor layer of a different type such as a silicon layer on a silicon germanium layer.

The semiconductor device further comprises one or more well regions over the substrate 500. In the example configuration in FIG. 7, the N-type well region 502 and P-type well region 504 are over the substrate 500, as described with respect to FIG. 4B.

As shown in FIG. 7, the semiconductor device further comprises an isolation structure 510 over the N-type well region and P-type well region. The isolation structure 510 electrically isolates various elements of the semiconductor device from each other. For example, the isolation structure 510 electrically isolates the fins 210-211 in the N-type well region from the fins 221 and 231 in the P-type well region. In the cross-section in FIG. 7, the isolation structure 510 has a thickness less than the fins (e.g. fins 210, 211, 221, and 231). In some embodiments, the isolation structure 510 comprises one or more shallow trench isolation (STI) regions. Example materials of the STI regions include, but are not limited to, silicon oxide, silicon nitride, silicon oxynitride, fluoride-doped silicate, and/or any other low k dielectric materials.

In the example configuration in FIGS. 5 and 6, the semiconductor device further comprises gate electrodes 250-254, isolation gates 300-303, dielectric dummy gates 310-313, and corresponding spacers 520, 521, 522, 523, 524, 525, 526, 527, 528 over the isolation structure 510 and the fins 210, 211, 221, 222, 223, 231, 232, 233. Other arrangements are within the scope of various embodiments. For example, in one or more embodiments, the gate electrodes 250-254 and/or isolation gates 300-303 and/or dielectric dummy gates 310-313, and/or one or more of the corresponding spacers 520, 521, 522, 523, 524, 525, 526, 527, 528 are partially embedded in the isolation structure 510. In some embodiments, a bottom of the dielectric dummy gate 310, 311, 312 or 313 is lower than a top surface of fin 221, 222 or 223. In some embodiments, the spacer 520 is in contact with the dielectric dummy gate 310 and the gate dielectric layer 530 wrapping around the isolation gate 300.

In the N-type well region, the gate electrodes 250-254 and isolation gates 300-303 straddle the fins 210 and 211. To electrically isolate the gate electrodes 250-254 and isolation gates 300-303 from the underlying fins 210 and 211, gate dielectric layers 530 are arranged under and around the corresponding gate electrodes 250-254 and isolation gates 300-303. In the P-type well region, the gate electrode 250 straddles the fins 221 and 231 (See FIG. 4B), the gate electrodes 251 and 252 straddle the fins 222 and 232 (See FIG. 4B) in the P-type well region, and the gate electrodes 253 and 254 straddle the fins 223 and 233 (See FIG. 4B) in the P-type well region. To electrically isolate the gate electrodes 250-254 from the corresponding fins 221, 231, 222, 232 and 223, 233, the gate dielectric layers 530 are further under and around the gate electrodes 250-254 in the P-type well region. The spacers 520-528 are on opposite sides of the corresponding gate dielectric layers 530.

Example materials of the gate dielectric layers 530 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In some embodiments, a gate dielectric layer includes multi-layer structure of, for example, $SiO_2$ with a high-k dielectric, or SiON with a high-k dielectric. Example materials of the spacers 520-528 include, but are not limited to, silicon oxide, silicon nitride, and silicon oxy-nitride.

In some embodiments, the gate electrodes 250-254 and the isolation gates 300-303 include one or more conductive layers and/or materials. In the example configuration in FIG. 7, the gate electrode 250 wraps over the fins 210-211 and 221, 231, and includes a first conductive gate material 261 over the N-type well region and a second conductive gate material 262 over the P-type well region. In some embodiments, the conductive gate materials 261 and 262 include the same conductive material. In some embodiments, the conductive gate materials 261 and 262 include different conductive materials. In some embodiments, the conductive material or materials of at least one of the conductive gate materials 261, 262 is/are selected in accordance with the type of device or transistor. For example, each of the conductive gate materials 261, 262 includes a conductive work function layer and a contact layer over the conductive work function layer.

In some embodiments, the work function layer is configured to have a work function in a range from about 4 eV to about 5 eV. In some embodiments, the first conductive gate material 261 includes a P-type work function metal (P-metal) for forming the PMOSFET over the N-type well region. Example P-metals include, but are not limited to, TiN, TaN, a carbon-doped metal nitride such as TaCN. In some embodiments, the second conductive gate material 262 includes an N-type work function metal (N-metal) for forming the NMOSFET over the P-type well region. Example N-metals include, but are not limited to, Ta, TiAl, and TiAlN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials.

In some embodiments, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

In some embodiments, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In some embodiments, the gate stack structure includes a $Si_3N_4$/metals/high-K dielectric structure in which the metals are, for example, Al/refractory metals, W/refractory metals, Cu/refractory metals, silicide, such as nickel silicide, cobalt silicide, tungsten silicide, tantalum silicide, titanium silicide, platinum silicide, erbium silicide, palladium silicide, the like, and combinations thereof.

In the example configuration in FIG. 7, the gate electrode 250 extends continuously from the N-type well region into the P-type well region, and the first conductive gate material 261 is in contact with the second conductive gate material 262. Other arrangements are within the scope of various embodiments. For example, in some embodiments, the gate dielectric layer 230 is interposed between and electrically isolates the first conductive gate material 261 and the second conductive gate material 262.

In some embodiments, the isolation gates 300-303 have the same material as the first conductive gate material 261. Stated differently, each of the isolation gates 300-303 comprises a conductive work function layer and a contact layer the same as that of the first conductive gate material 261. In some embodiments where the conductive gate materials 261 and 262 include the same conductive material, the isolation gates 300-303 have the same material as the conductive gate materials 261 and 262.

In the example configuration of FIG. 6, the spacers 520, 522, 525, 528 are in contact with opposite sides of the corresponding dielectric dummy gates 310-313. The dielectric dummy gates 310-313 are in contact with the corresponding fins 221-233. Fins 221 and 222 are separated by the dielectric dummy gate 311 and thus are electrically isolated from each other, and fins 222 and 223 are separated by the dielectric dummy gate 312 and thus are electrically isolated from each other. For example, the dielectric dummy gate 311 have opposite sidewalls SW1 and SW2 respectively in contact with the fins 221 and 222, and the dielectric dummy gate 312 have opposite sidewalls respectively in contact with the fins 222 and 223. The dielectric dummy gate 310 have opposite sidewalls respectively in contact with the fin 221 and the STI region 510, and the dielectric dummy gate 313 have opposite sidewalls respectively in contact with the fin 223 and the STI region 510. The dielectric dummy gates 310-313 have top surfaces substantially coplanar with top surfaces of the gate electrodes 250-254 due to, e.g., a planarization process during manufacture.

The source contacts 270 and drain contacts 280 in FIG. 4B can be referred to as contact plugs and are shown in FIGS. 5 and 6 with a label "CO." The contact plugs 270 and 280 are arranged in between corresponding adjacent spacers 520-528. In the example configuration in FIGS. 5 and 6, the top surfaces of the contact plugs 270 and 280 are coplanar with each other due to, e.g., a planarization process during manufacture. Other arrangements are within the scope of various embodiments.

In the semiconductor device, the source contact plugs 270 are respectively in contact with sources, and the drain contact plugs 280 are respectively in contact with drains. The sources and drains are arranged between corresponding adjacent gate electrodes 250-254, isolation gates 300-303 and dielectric dummy gates 310-313. In one or more embodiments, portions of the fins 210-211, 221-223 and 231-233 between the adjacent spacers are recessed to form S/D cavities having bottom surfaces lower than the top surfaces of the fins 210-211, 221-223 and 231-233. After the formation of the S/D cavities, sources and drains are formed by epitaxially growing a strained material in the S/D cavities. In some embodiments, the lattice constant of the strained material is different from the lattice constant of the fins. Thus, channel regions of the transistors are strained or stressed to enhance carrier mobility of the transistors.

For example, for a PMOSFET, the strained material is configured to apply a compressive stress to enhance hole mobility in the channel region of the PMOSFET. For an NMOSFET, the strained material is configured to apply a tensile stress to enhance electron mobility in the channel region of the NMOSFET. Examples of the strained material include, but are not limited to, SiGe, SiGeC, SiC, GeSn, SiGeSn, SiP, SiCP and other suitable materials. In some embodiments, the strained material for a PMOS device comprises SiGe, SiGeC, Ge, Si, or a combination thereof. In some embodiments, the strained material for an NMOSFET comprises SiC, SiP, SiCP, Si, or a combination thereof. In the example configuration in FIGS. 5 and 6, top surfaces of the strained material in the sources and drains extend upward above the top surfaces of the fins 210, 221, 222 and 223. Other arrangements are within the scope of various embodiments. For example, in some embodiments, top surfaces of the strained material in the sources and drains are lower than the top surfaces of the fins 210, 221, 222 and 223.

In some embodiments, the epitaxial growth of the sources and drains is facilitated or improved in a fully dense gate environment. Such an environment is achievable when dielectric dummy gates are arranged alongside gate electrodes so as to promote epitaxial growth of the sources and drains between gate electrodes and adjacent dielectric dummy gates. For example, in the example configuration in FIG. 6, the presence of the dielectric dummy gate 310 facilitates epitaxial growth of the source between the dummy gate 310 and the adjacent gate electrode 250. As a result, circuit density and/or performance improvements are achievable in one or more embodiments.

FIGS. 9A-14C illustrate various processes at various stages of manufacturing a semiconductor device in accordance with some embodiments of the present disclosure. In FIGS. 9A-14C, figures ending with an "A" designation (e.g., FIGS. 9A, 10A, etc.) illustrate a cross-sectional view taken along line 5-5 shown in FIG. 4B, figures ending with an "B" designation (e.g., FIGS. 9B, 10B, etc.) illustrate a cross-sectional view taken along line 6-6 shown in FIG. 4B, and figures ending with an "B" designation (e.g., FIGS. 9C, 10C, etc.) illustrate a cross-sectional view taken along line 9-9 shown in FIG. 4B. It is understood that additional operations can be provided before, during, and after the processes shown by FIGS. 9A-14C, and some of the operations described below can be replaced or eliminated, for additional embodiments of the method. The order of the operations/processes may be interchangeable. In the example configurations described with respect to FIGS. 9A-14C, the semiconductor device comprises FinFET devices. Other arrangements, such as planar MOS devices, are within the scope of various embodiments.

Figure 9A:
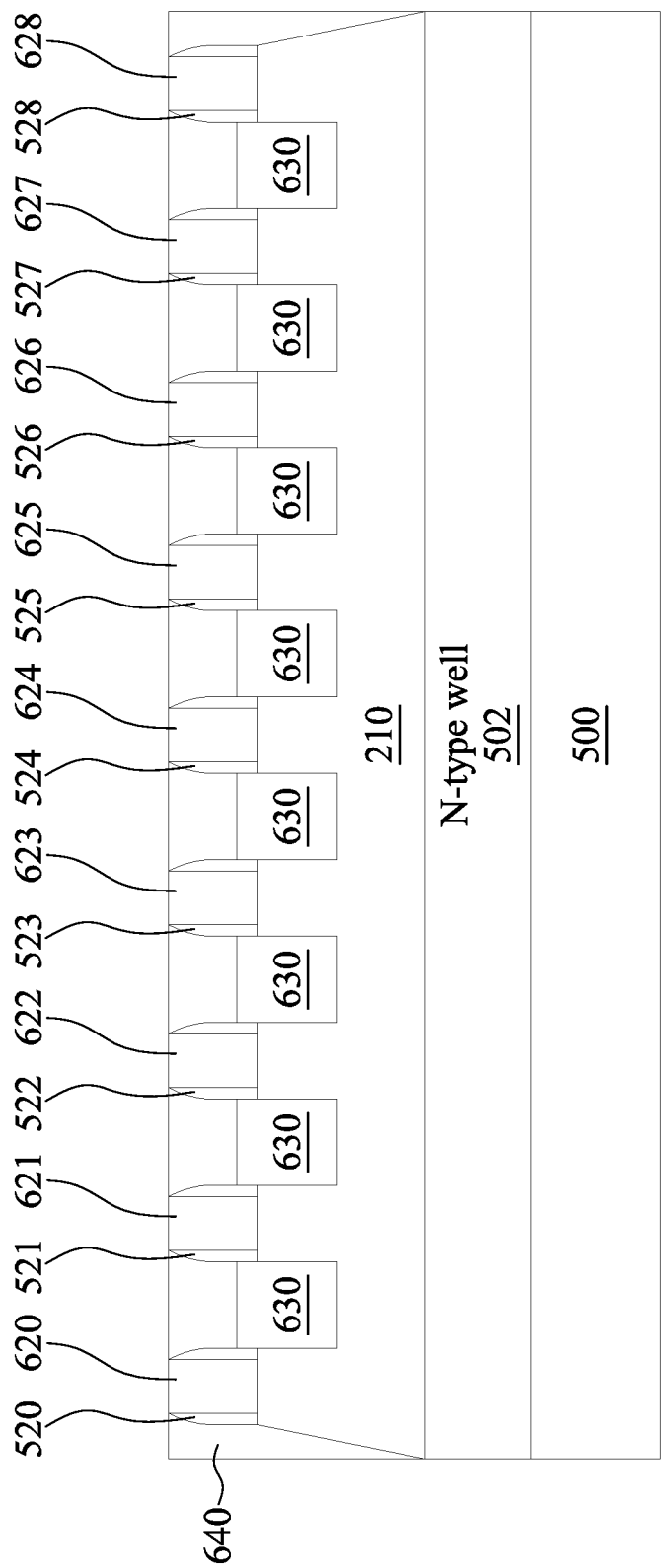
FIGS. 9A, 10A, 11A, 12A, 13A and 14A are exemplary cross-sectional views corresponding to the line 5-5 illustrated in FIG. 4B at various stages of manufacturing a semiconductor device according to some embodiments of the present disclosure.
Figure 9B:
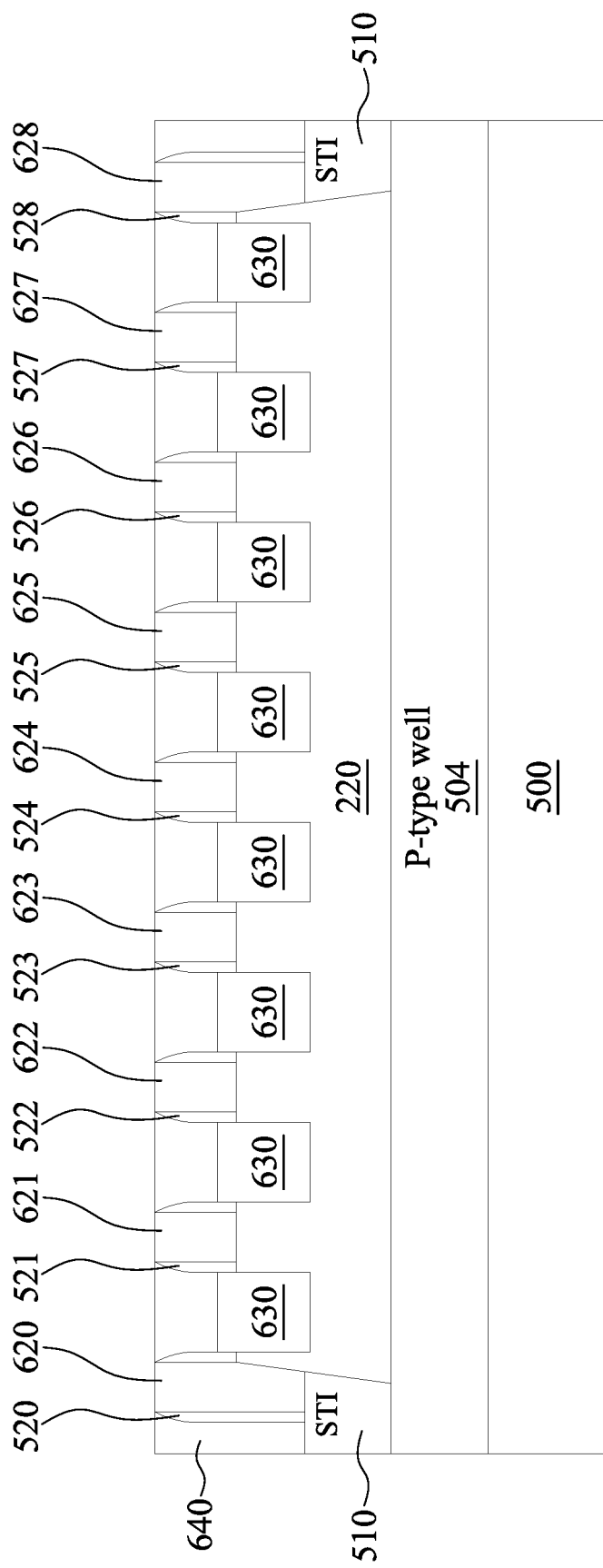
FIGS. 9B, 10B, 11B, 12B, 13B and 14B are exemplary cross-sectional views corresponding to the line 6-6 illustrated in FIG. 4B at various stages of manufacturing a semiconductor device according to some embodiments of the present disclosure.
Figure 9C:
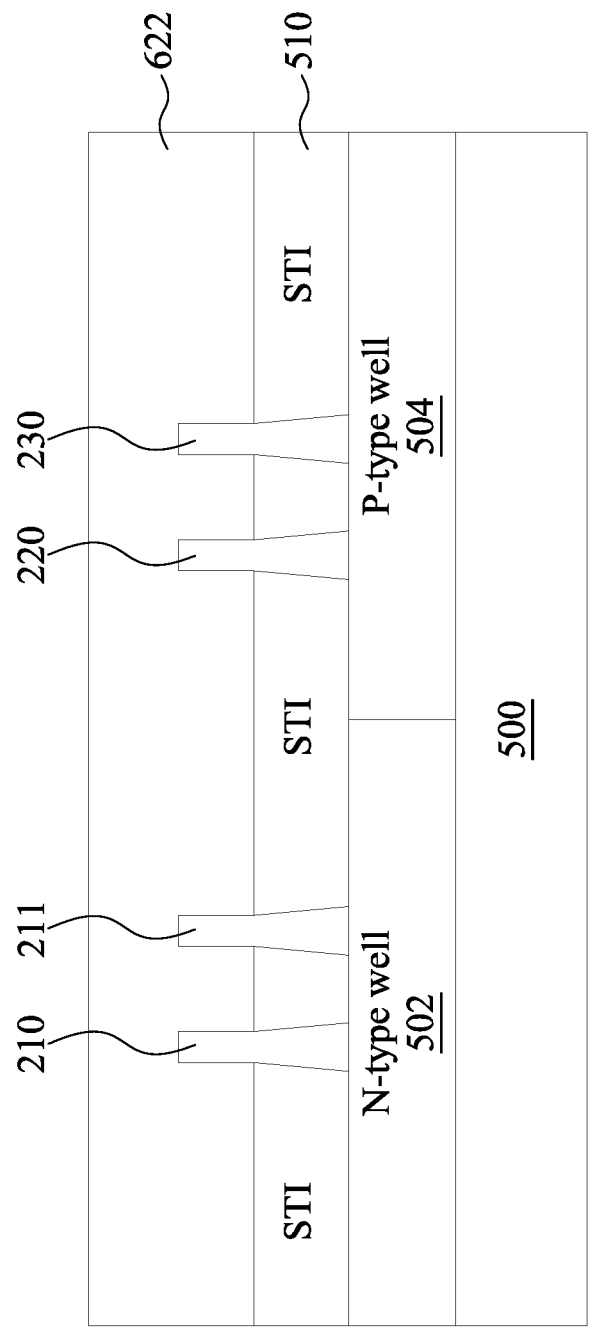
FIGS. 9C, 10C, 11C, 12C, 13C and 14C are exemplary cross-sectional views corresponding to the line 9-9 illustrated in FIG. 4B at various stages of manufacturing a semiconductor device according to some embodiments of the present disclosure.

As illustrated in FIGS. 9A-9C, an N-type well region and a P-type well region are formed in a substrate 500. In some embodiments, the N-type well region and P-type well region are formed by doping the substrate 500 with corresponding N-type and P-type dopants by ion implantation. Example P-type dopants include, but are not limited to, boron or $BF_2$. Example N-type dopants include, but are not limited to, phosphorus and arsenic.

A plurality of fins are formed over the N-type well region and P-type well region. As shown in FIGS. 9A-9C, fins 210 and 211 are formed over the N-type well region, and fins 220 and 230 are formed over the P-type well region. Example materials of the fins 210-211 and 220-230 include, but are not limited to, silicon, germanium or compound semiconductor. In certain embodiments, the fins 210 and 211 are formed of SiGe (for strain effect enhancement), and the fins 220 and 230 are formed of a non-germanium-containing material, for example, Si.

The fins 210-211 and 220-230 are formed by one or more suitable process including, but not limited to, deposition, photolithography, and/or etching processes. In an example, the fins 220-230 are formed by patterning and etching a portion of the silicon substrate 500. In another example, the fins are formed by patterning and etching a silicon layer deposited overlying an insulator layer (for example, an upper silicon layer of a silicon-insulator-silicon stack of an SOI substrate). In some embodiments, the fins 210 and 211 are formed of SiGe, and the fins 220-230 are formed of Si. Formation of the SiGe fins 210 and 211 includes, for example, removing the S1 fins from the N-type well region 502 and epitaxially growing SiGe fins from where the Si fins are removed.

An isolation structure 510 is formed over the substrate 500 to define and electrically isolate the fins. In some embodiments, the isolation structure 510 includes shallow trench isolation (STI) regions. Example materials of the isolation structure 510 include, but are not limited to, silicon oxide, silicon nitride, silicon oxynitride, fluoride-doped silicate glass (FSG), a low-K dielectric material, and/or combinations thereof. In an example, the formation of the isolation structure 510 includes filling trenches between the fins, for example, by a chemical vapor deposition (CVD) process, with a dielectric material, performing a chemical mechanical planarization (CMP) process to the dielectric material, and etching back the dielectric material such that the fins protrude above the dielectric material. In some embodiments, the filled trench has a multi-layer structure, such as a thermal oxide liner layer filled with silicon nitride or silicon oxide.

In some embodiments, a p-type species doped process and an n-type species doped process are performed after the formation of the isolation structure 510. In some other embodiments, the p-type species doped process and the n-type species doped process are performed before the formation of the isolation structure 510. The p-type species doped process comprises a p-well lithography patterning, a p-well doped formation and a p-type channel doping for n-type devices, such as NMOSFETs. The n-type species doped process comprises an n-well lithography pattering, an n-well doped formation and an n-type channel doping for p-type devices, such as PMOSFETs.

A plurality of gates 620, 621, 622, 623, 624, 625, 626, 627 and 628 are formed over the substrate 500, crossing the fins. Example materials of the gates include, but are not limited to, poly-silicon, doped poly-silicon with uniform or non-uniform doping or un-doped polysilicon. The gates 620-628 are referred to herein as poly gates. In some embodiments, gate dielectric layers are formed under the poly gates. In one or more embodiments, the poly gates are formed by depositing a poly-silicon layer over the substrate 500 with the fins and the isolation structure 510 thereon, in a low-pressure chemical vapor deposition (LPCVD) process or a plasma-enhanced chemical vapor deposition (PECVD) process. In some embodiments, a layer of photoresist is formed over the poly-silicon layer by a suitable process, such as, spin-on coating. The layer of photoresist is patterned to form patterned photoresist features by a proper lithography patterning process. The patterned photoresist features are then transferred by a dry etching process to the underlying poly-silicon layer to form the poly gates. The patterned photoresist layer is stripped thereafter.

In some other embodiments, a first hard mask layer is formed over the poly-silicon layer, a patterned photoresist layer is formed over the hard mask layer, and the pattern of the photoresist layer is transferred to the first hard mask layer and the poly-silicon layer. As a result, the poly gates and corresponding hard masks over the top surfaces of the poly gates are formed. Example materials of the hard masks include, but are not limited to, silicon oxide, silicon nitride, silicon oxynitride, and/or other suitable dielectric materials. The hard mask layer is formed in one or more embodiments by a method such as chemical vapor deposition (CVD) or physical vapor deposition (PVD).

A plurality of spacers 520-528 are formed on sidewalls of the corresponding poly gates 620-628. In some embodiments, a dielectric layer is formed over the poly gates 620-628 and the substrate 500, and covers sidewalls of the poly gates 620-628. Example dielectric materials include, but are not limited to, silicon oxide, silicon nitride, and silicon oxy-nitride. The dielectric layer is formed by CVD, PVD, atomic layer deposition (ALD), or other suitable technique. An anisotropic etching is performed on the dielectric layer to form pairs of spacers on opposite sidewalls of the corresponding poly gates 620-628.

Source/drain (SD) regions 630 are formed over the fins and between the facing spacers of the adjacent poly gates. In one or more embodiments, portions of the fins, e.g., the fin 210, between the facing spacers of the adjacent poly gates are recessed to form S/D cavities having bottom surfaces lower than the top surface of the fin 210. For example, a biased etching process is performed to form the S/D cavities, using the hard masks on top of the poly gates and the spacers as etching masks. After the formation of the S/D cavities, S/D regions 630 are produced by epi-growing a strained material in the S/D cavities as described herein. In some embodiments, a pre-cleaning process is performed to clean the S/D cavities with HF or other suitable solution. Then, the strained material, such as silicon germanium (SiGe) is selectively grown by an LPCVD process to fill the S/D cavities.

An interlayer dielectric (ILD) layer 640 is deposited over the substrate 500 having the poly gates, spacers, fins and S/D regions thereon. Example materials of the ILD layer 640 include, but are not limited to, silicon oxide, spin-on glass (SOG), fluorinated silica glass (FSG), carbon doped silicon oxide, other suitable dielectric materials, and/or combinations thereof. In some embodiments, the ILD layer 640 is formed by a high density plasma (HDP) process. In one or more embodiments, the ILD layer 640 is planarized by a chemical mechanical polishing (CMP) process to remove a thickness of the ILD layer 640 and the hard masks on tops of the poly gates, and to expose top surfaces of the poly gates.

Figure 10A:
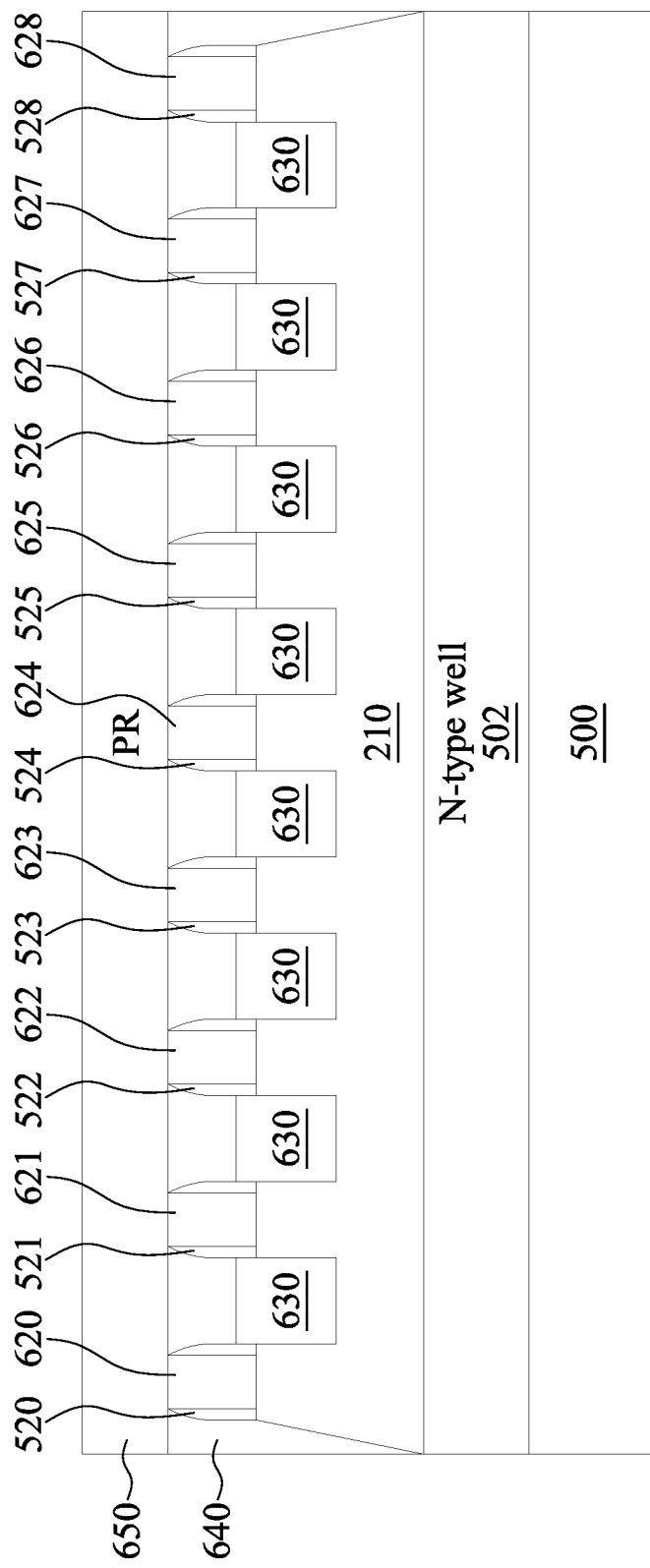
Figure 10B:
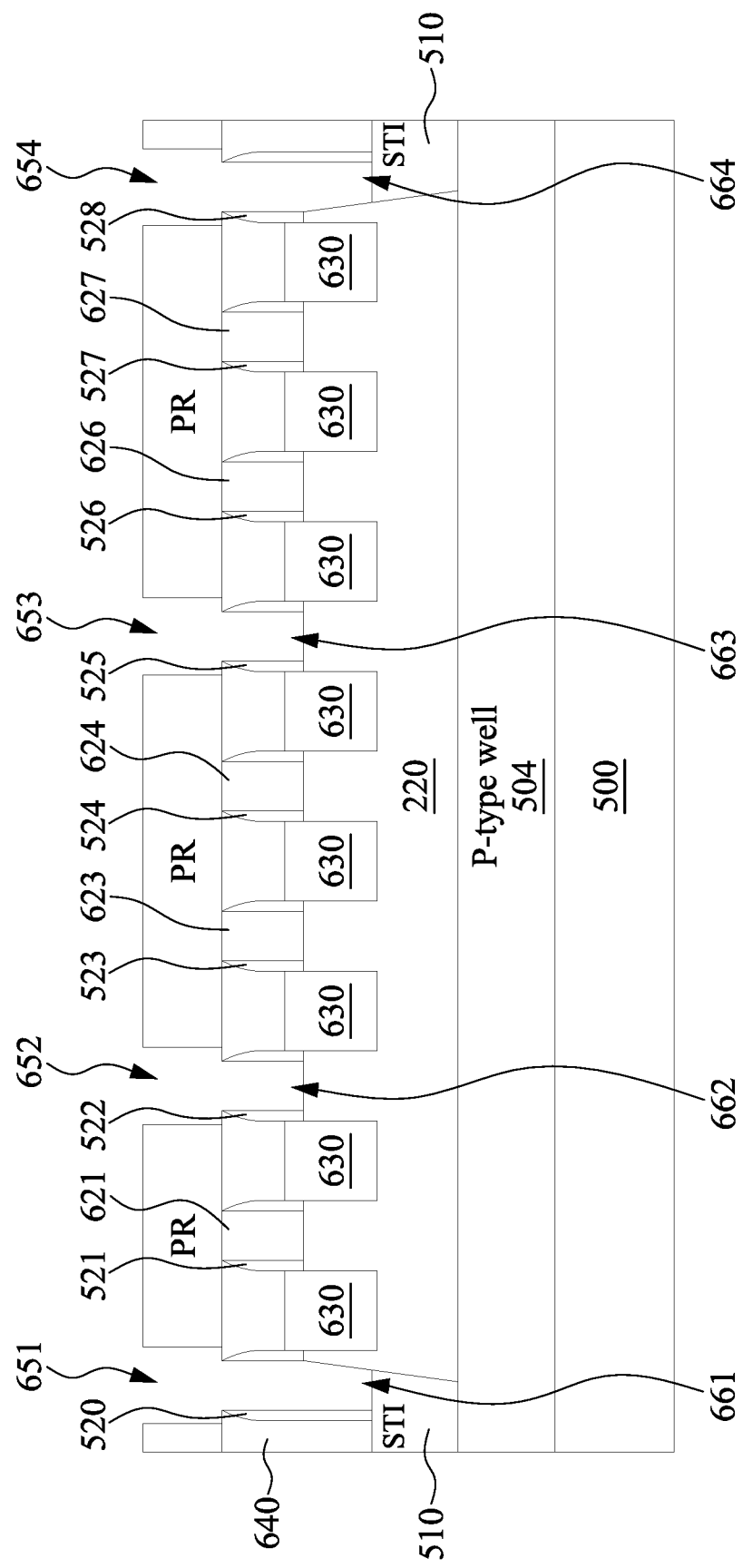
Figure 10C:
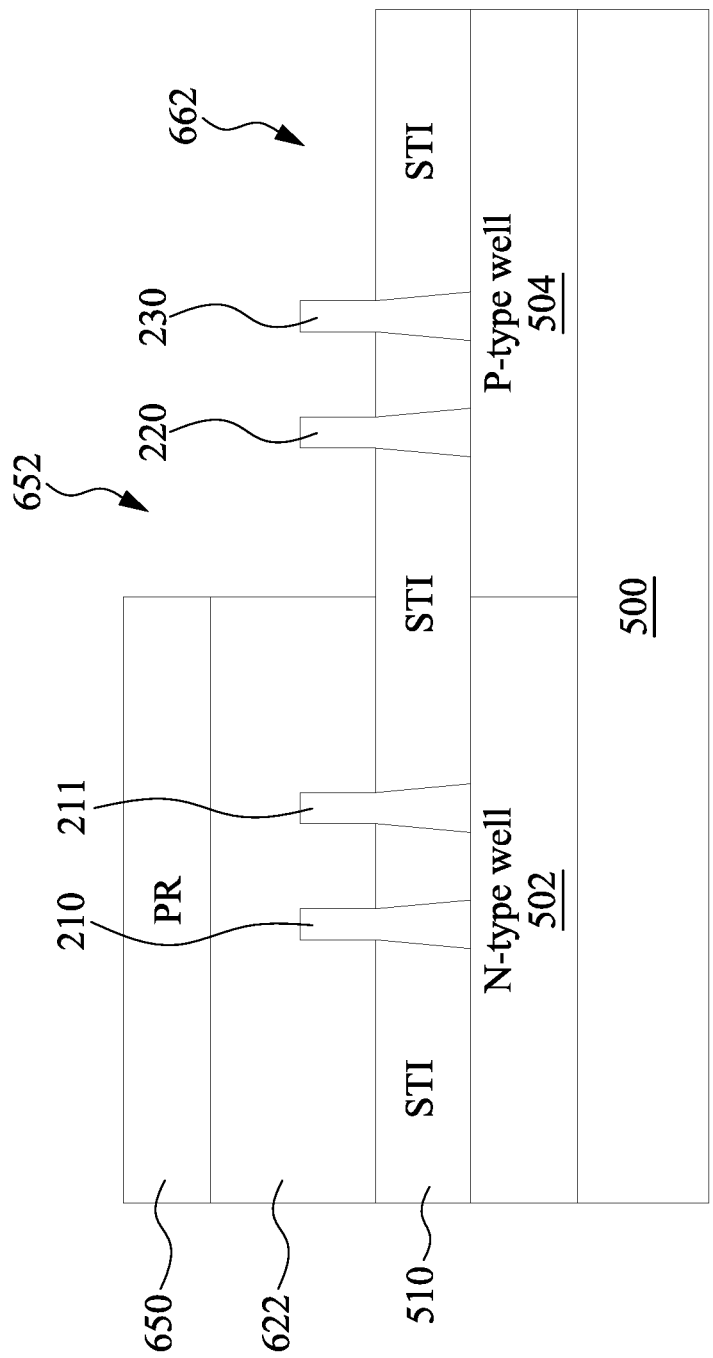

As illustrated in FIGS. 10A-10C, the poly gates corresponding to dielectric dummy gates in the semiconductor device being manufactured are removed. In some embodiments, a photoresist layer 650 (designated as "PR" in FIGS. 10A-10C) is deposited over the substrate 500 by a suitable process, such as spin-on coating. The photoresist layer 650 is patterned to form openings 651, 652, 653 and 654 to expose first portions of the poly gates 620, 622, 625 and 628 over the P-type well where the dielectric dummy gates are to be formed, and second portions of the poly gates 620, 622, 625 and 628 over the N-type well remain covered by the photoresist layer 650. The exposed portions of the poly gates 620, 622, 625 and 628 are removed, for example, by a wet etch and/or a dry etching process, to form corresponding openings 661, 662, 663, 664 between the corresponding pairs of spacers. In the poly gate etching, the photoresist layer 650 and the ILD layer 640 are used as etching masks. In some embodiments, the gate dielectric layers formed under the poly gates 620, 622, 625 and 628 remain in the openings 661, 662, 663, 664 between the corresponding pairs of spacers. In some embodiments, the gate dielectric layers formed under the poly gates 620, 622, 625 and 628 are removed to expose fins 220 and 230 and the isolation structure 510.

Figure 11A:
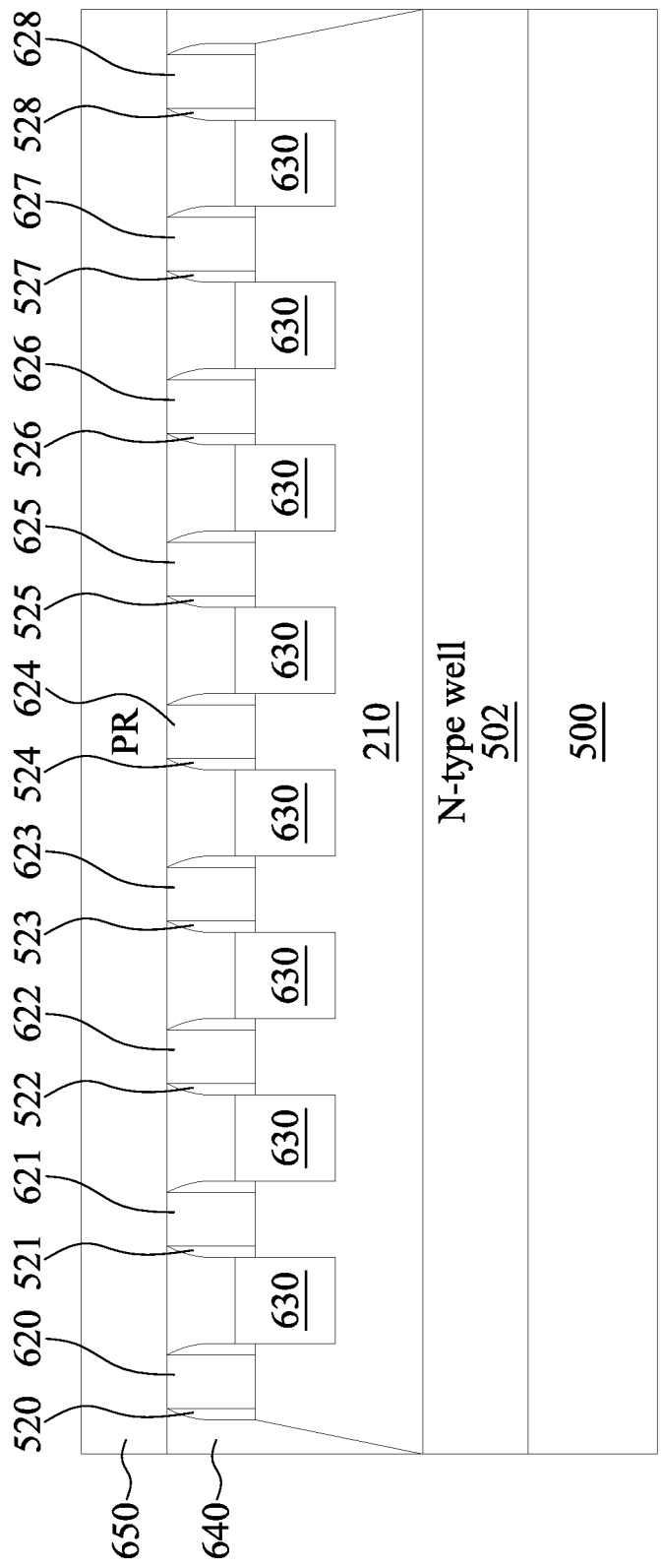
Figure 11B:
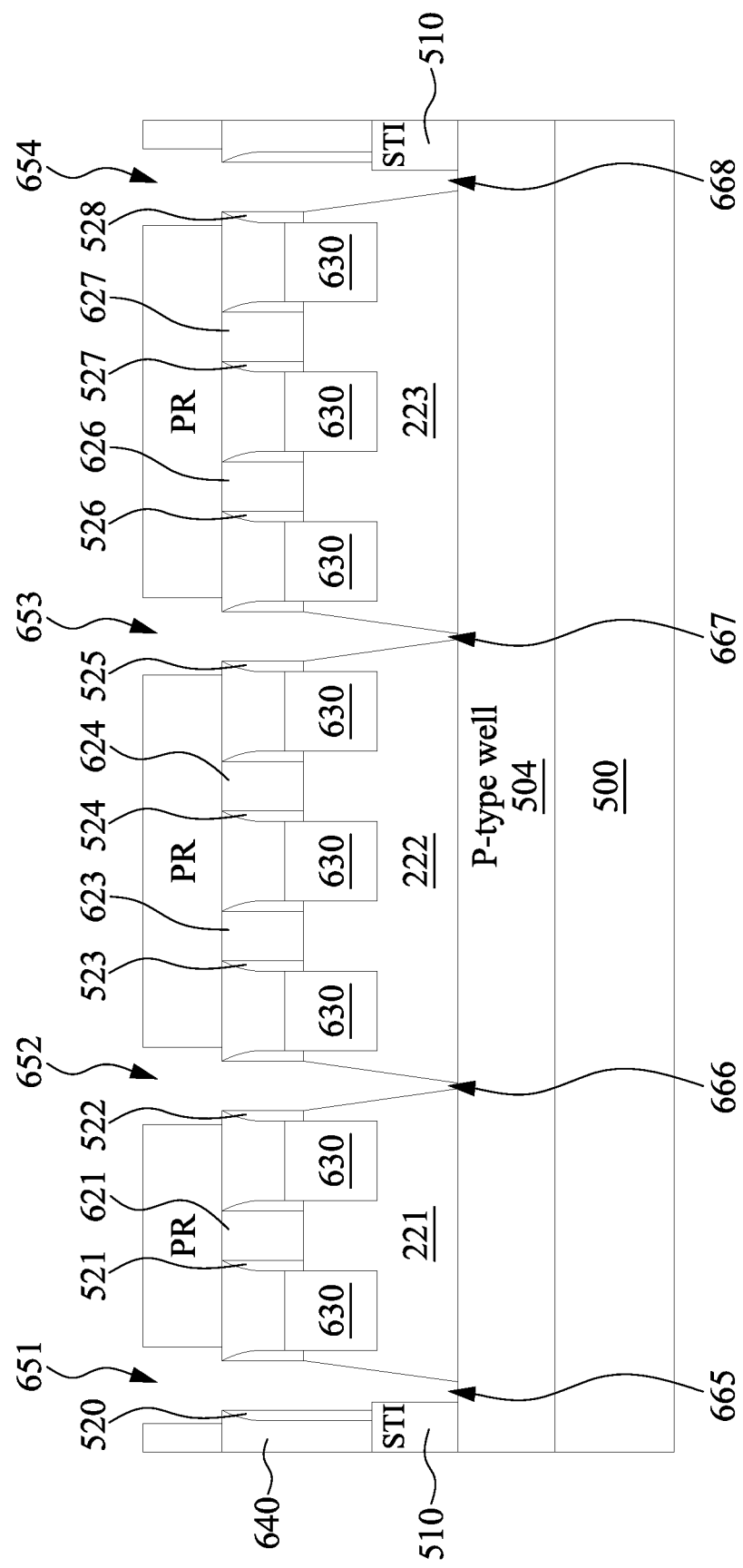
Figure 11C:
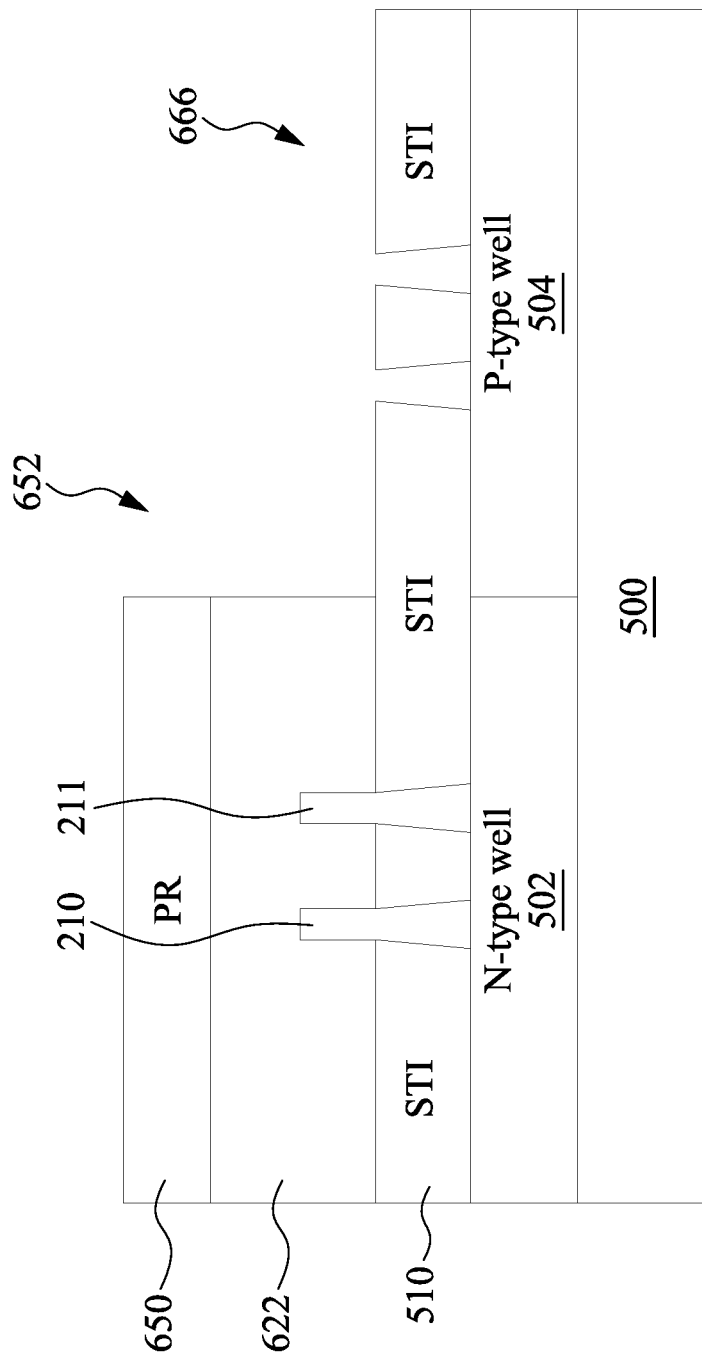

A selective fin etching process is performed in one or more embodiments to break one or more fin into smaller fins for different circuits. For example, as illustrated in FIGS. 11A-11C, an etching process is performed to further deepen the openings 661, 662, 663 and 664 and remove at least portions of the fins 220 and 230 and the isolation structure 510. Resulting openings 666 and 667 are obtained and split the fin 220 into the fins 221, 222 and 223. Moreover, the openings 666 and 667 spit the fin 230 into the fins 231, 232 and 233 (as shown in FIG. 4B) as well. In some embodiments, the fin etching process includes a self-aligned etch using the same etching mask, i.e., the photoresist layer 650 and the ILD layer 640, as the etching mask used in the poly gate etching described with respect to FIGS. 10A-10C. As a result, an additional mask and associated cost is avoidable in some embodiments. In some embodiments, the described selective fin etching process is omitted.

Figure 12A:
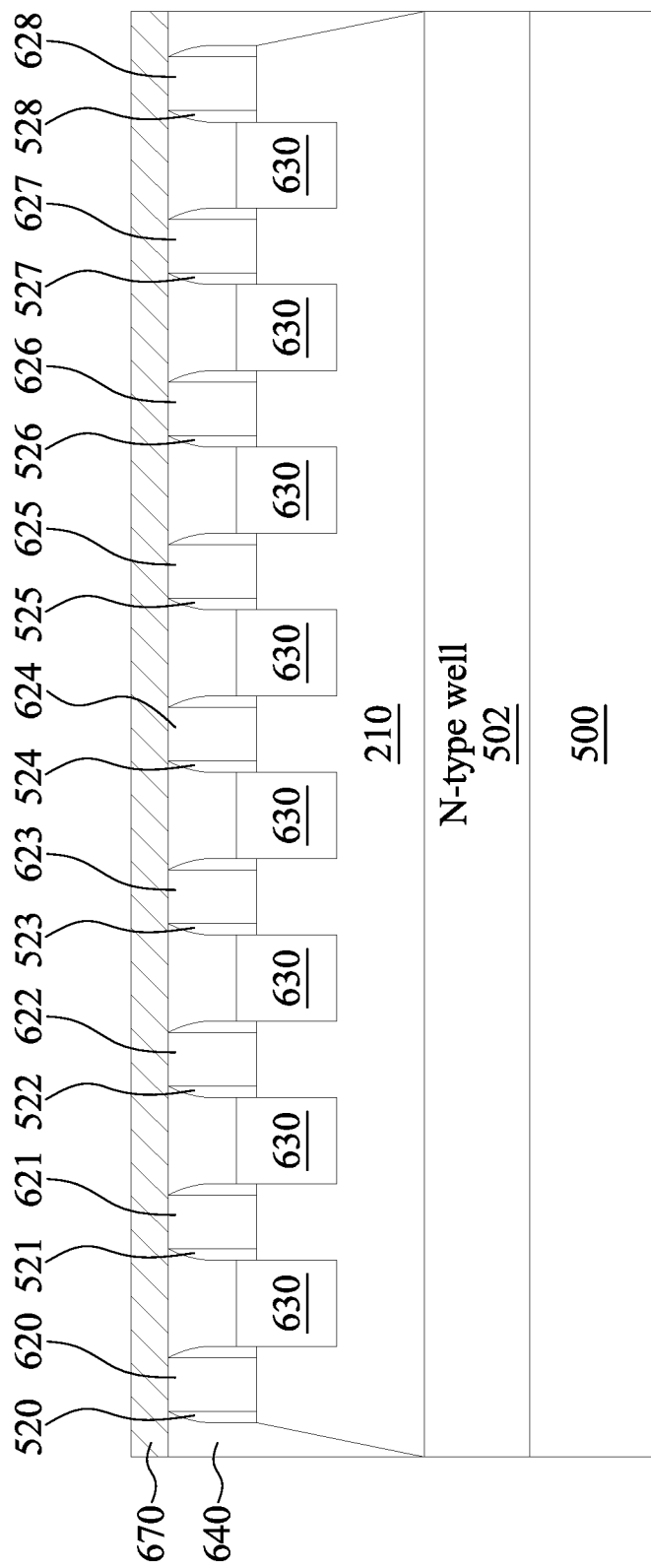
Figure 12B:
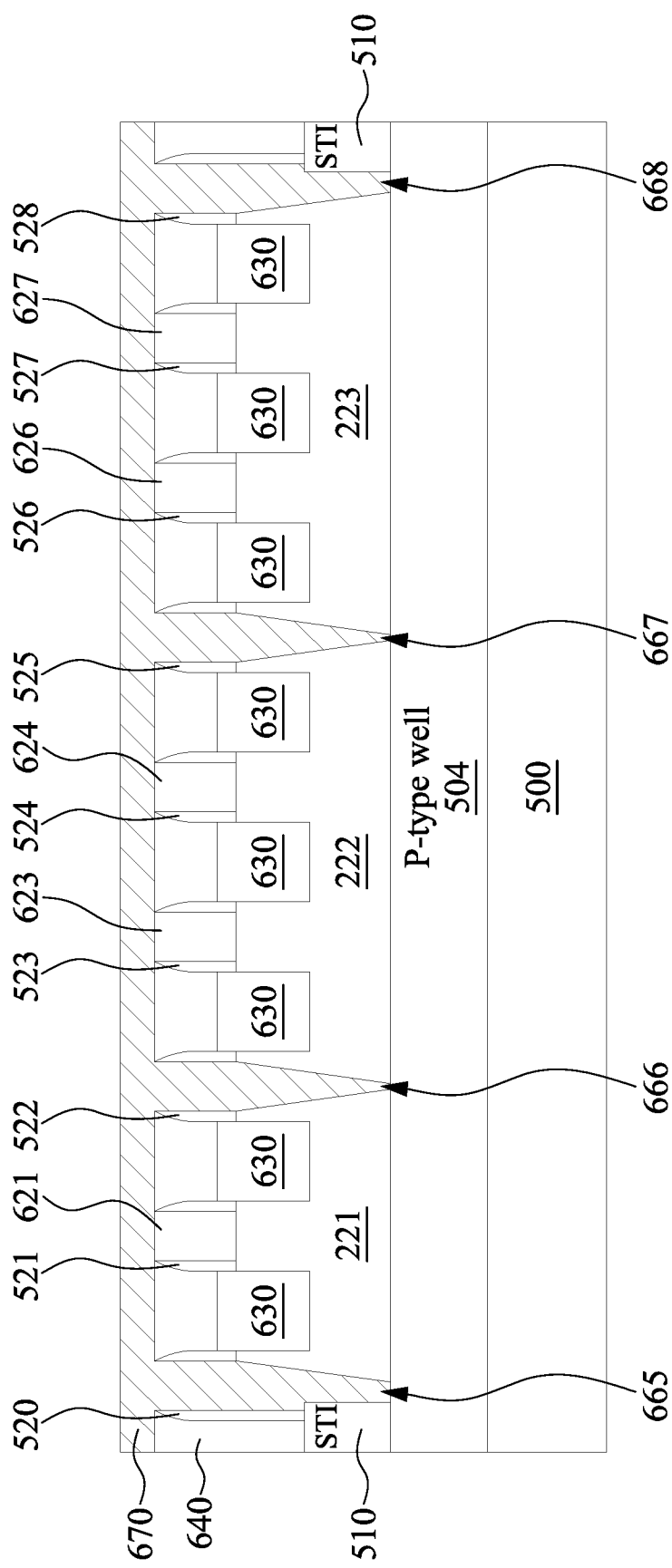
Figure 12C:
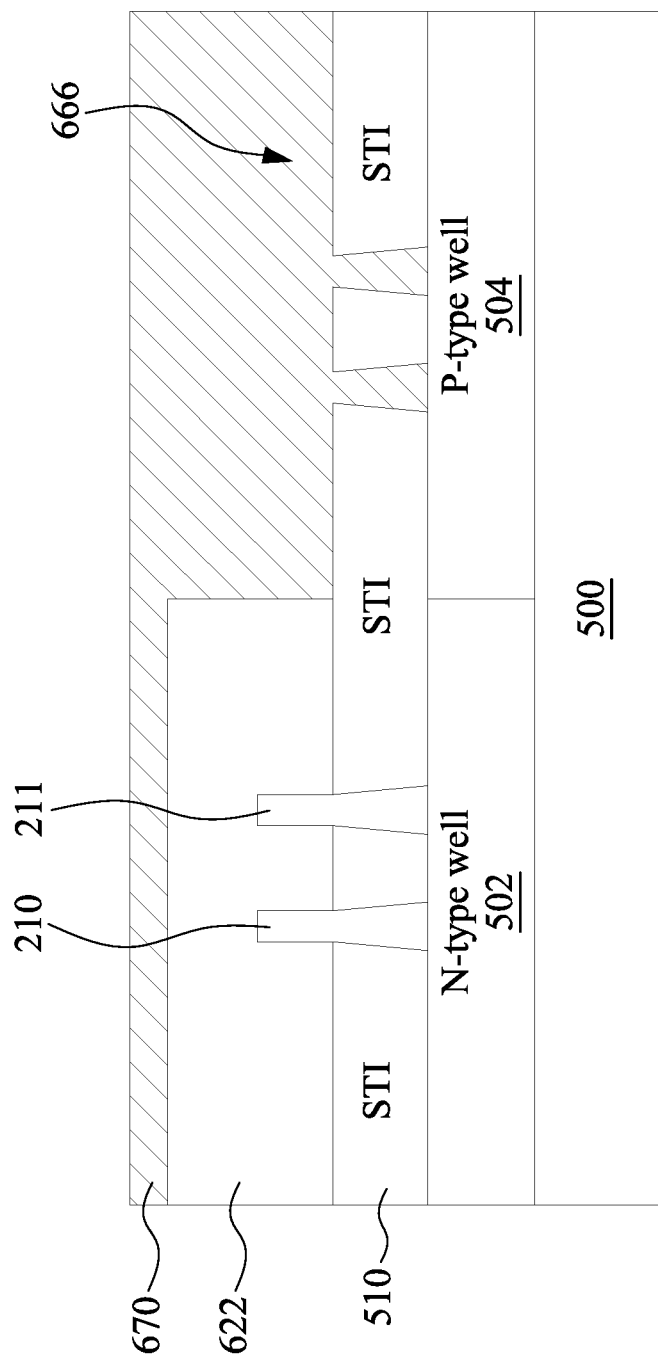
Figure 13A:
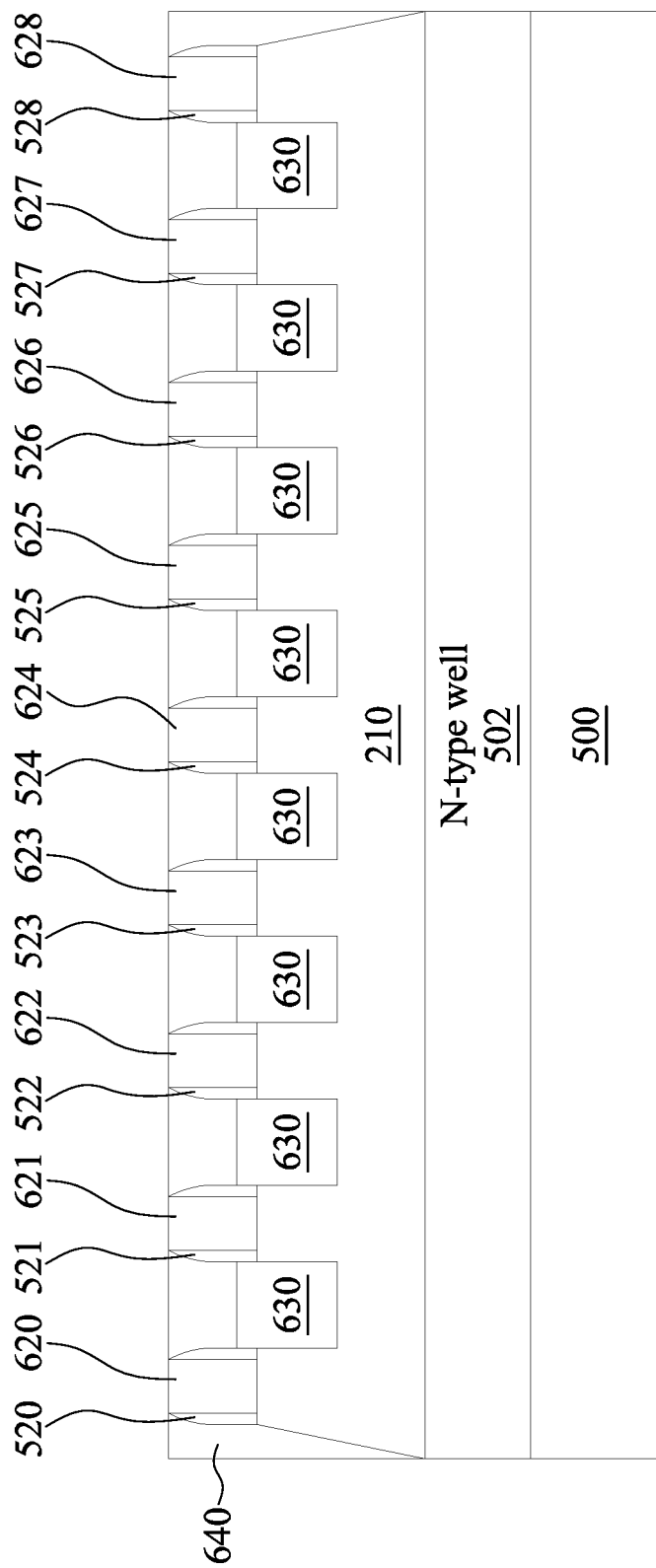
Figure 13B:
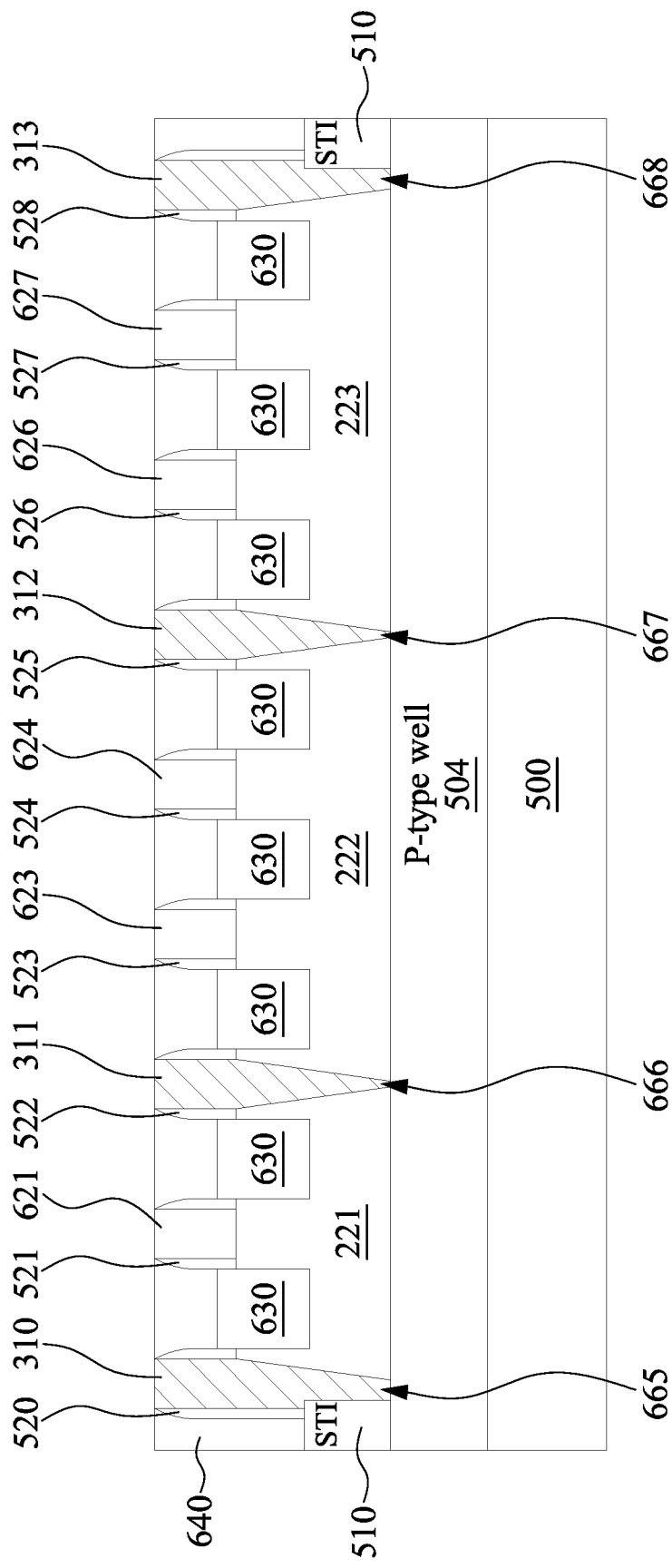
Figure 13C:
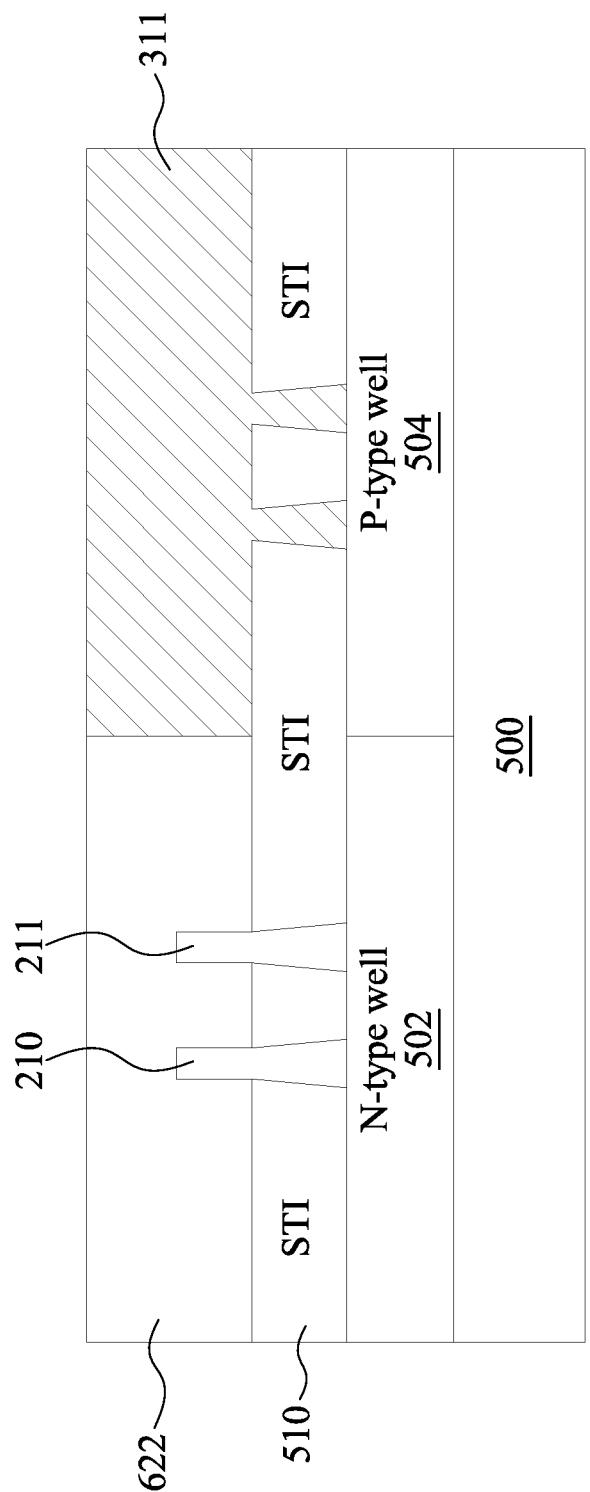

As illustrated in FIGS. 12A-12C, a dielectric material 670 is formed over the substrate 500 and fills in the openings 665, 666, 667 and 668. Thereafter, a CMP process is performed to planarize the deposited dielectric material 670. The dielectric material remaining in the openings 665, 666, 667 and 668 configure corresponding dielectric dummy gates 310, 311, 312 and 313 as described previously. The resulting structure is illustrated in FIGS. 13A-13C.

Figure 14A:
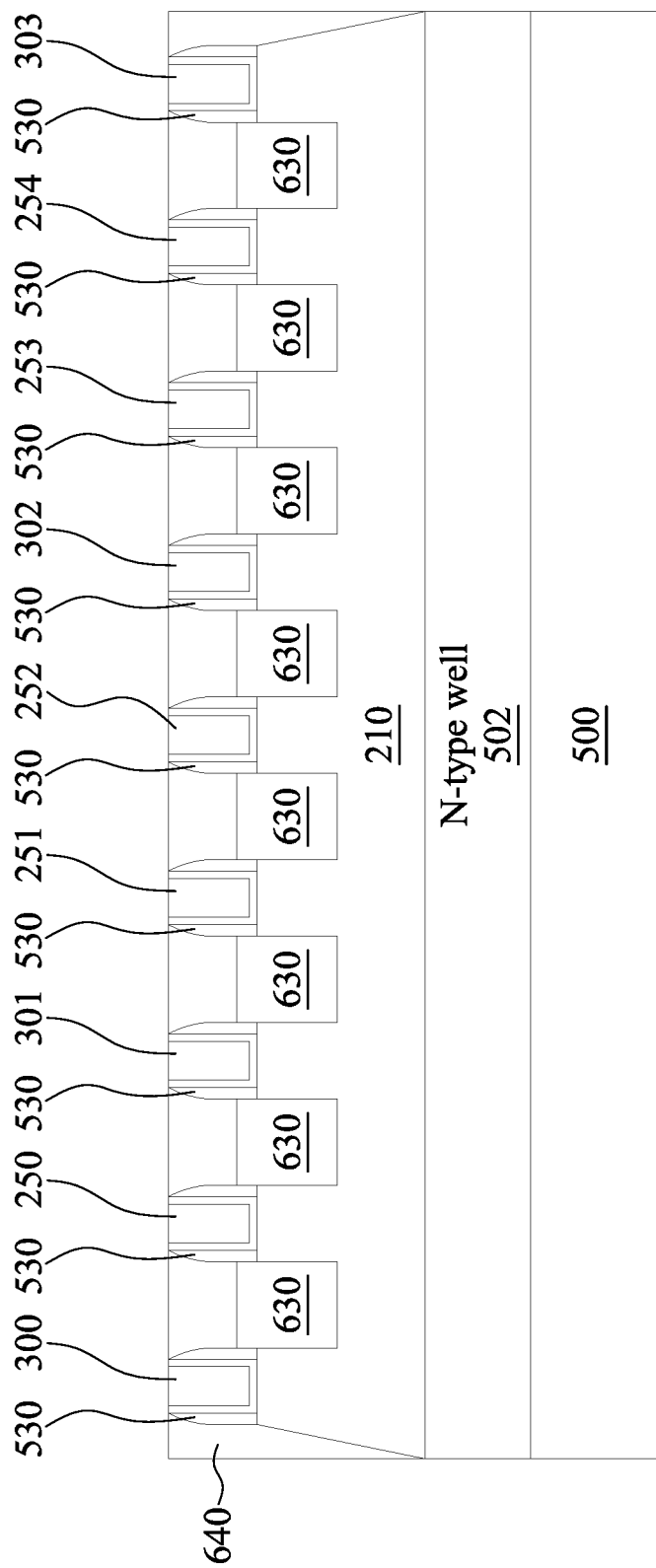
Figure 14B:
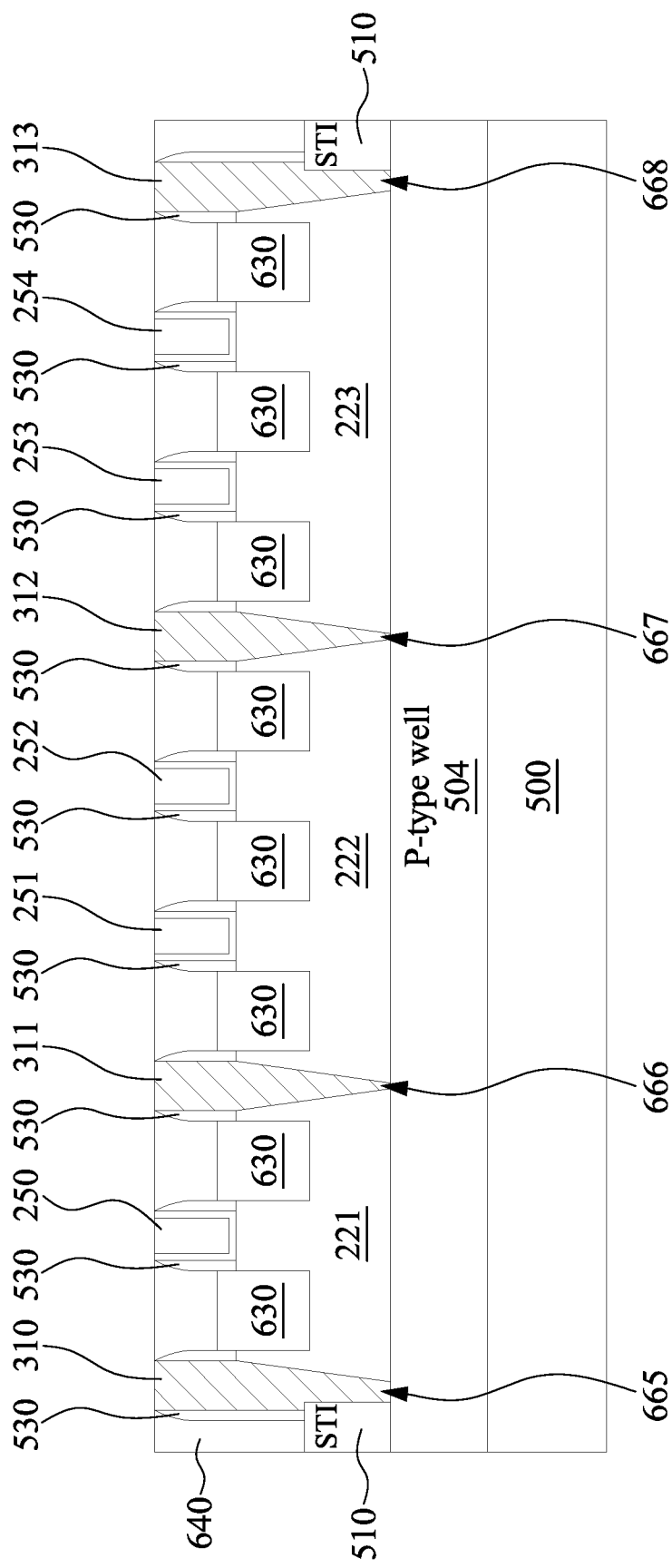
Figure 14C:
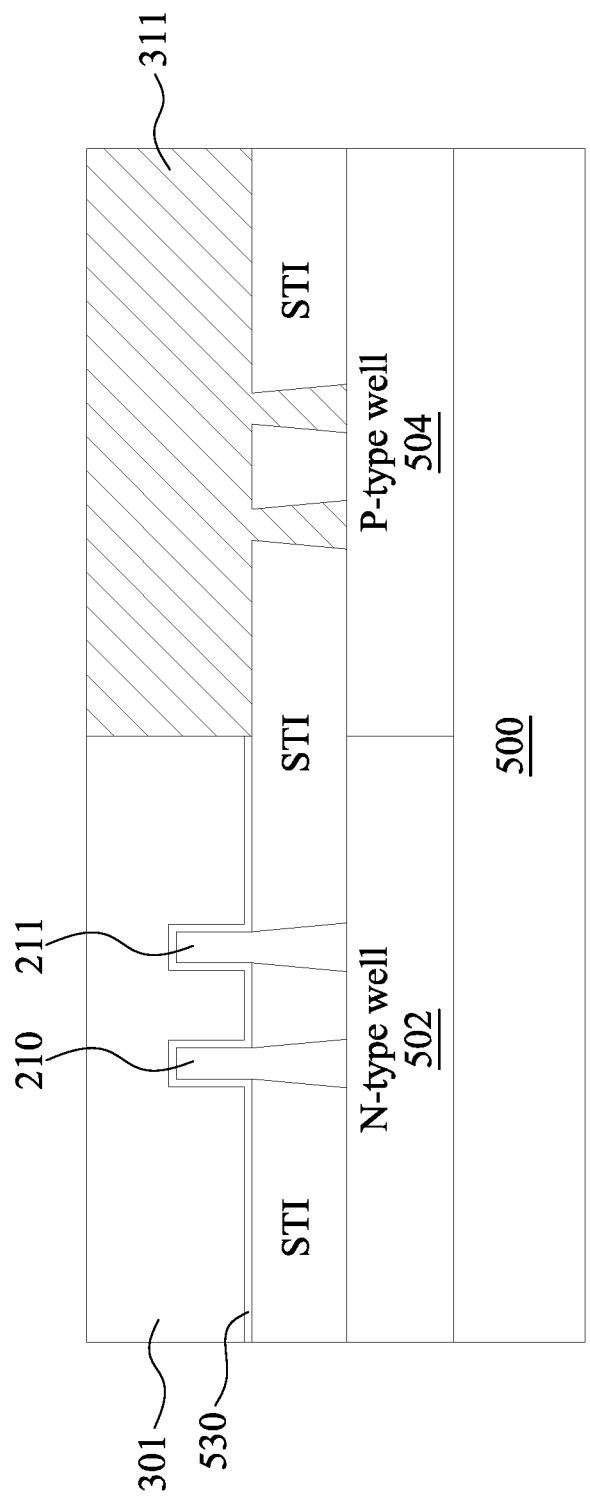

As illustrated in FIGS. 14A-14C, remaining poly gates 620-628 are selectively removed to form openings that expose the underlying fins. One or more conductive materials of the corresponding replacement gate electrodes 250-254 and isolation gates 300-303 are filled in the openings over the remaining gate dielectric layers previously formed under the poly gates. In some embodiments, the gate dielectric layers formed under the poly gates are also removed and new gate dielectric layers are deposited in the openings between the corresponding pairs of spacers. In some embodiments, the conductive materials of the gate electrodes 250-254 and isolation gates 300-303 include a work function layer and/or a contact layer as described herein. A planarization process is performed to remove the conductive materials outside the gate electrodes 250-254 and isolation gates 300-303. Further processes, such as a gate contact formation process and a S/D contact formation process, are performed in one or more embodiments.

Figure 15:
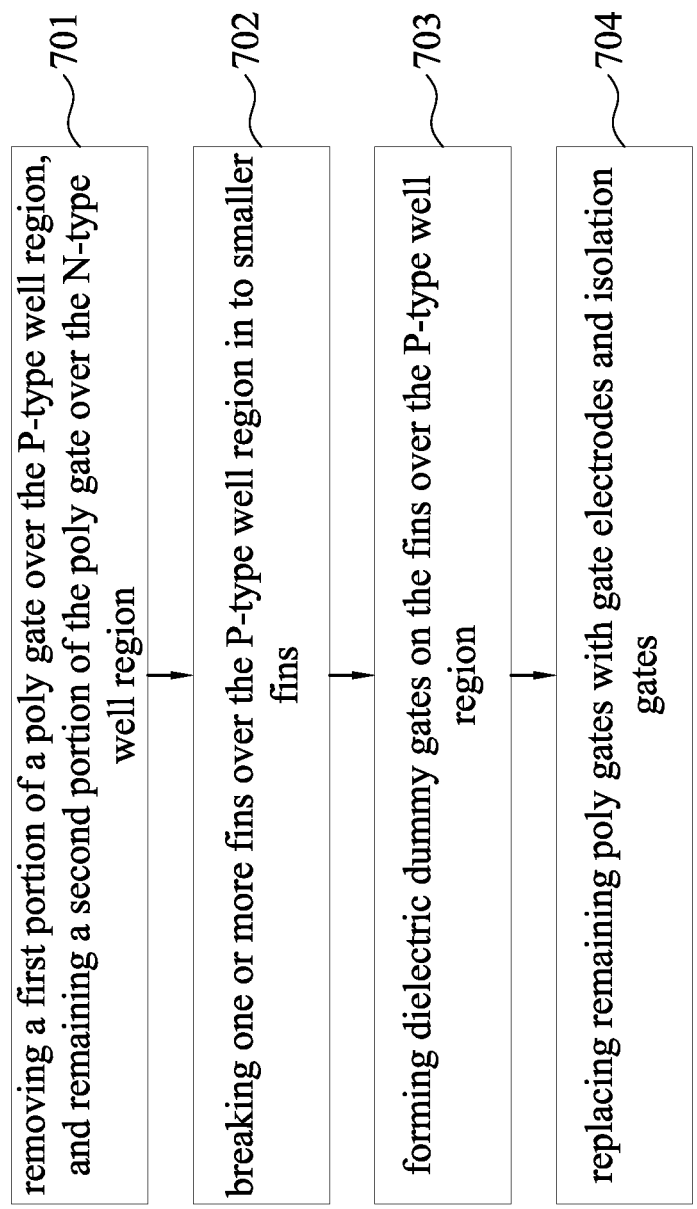
FIG. 15 is a flow chart of a method of manufacturing a semiconductor device in accordance with some embodiments of the present disclosure.

FIG. 15 is a flow chart of a method of manufacturing a semiconductor device, in accordance with some embodiments. At operation 701 in FIG. 15, a first portion of a poly gate over the P-type well region is removed, while remaining a second portion of the poly gate over the N-type well region. For example, as described with respect to FIGS. 9A-11C, first portions of the poly gates 620, 622, 625 and 628 over the P-type well are removed to form openings 661, 662, 663, 664 that expose portions of the fins 220 and 230, second portions of the poly gates 620, 622, 625 and 628 over the N-type well remain to cover the fins 210 and 211. In some embodiments, an end-cut removing process for gate electrodes is performed together with operation 701. An end-cut removing or patterning process is performed to define the ends of one or more of the gate electrodes. A manufacturing process in accordance with some embodiments further includes a line-cut patterning process performed to define gate lines of the one or more gate electrodes.

At operation 702, one or more fins over the P-type well region are broke in to smaller fins for different circuit cells. For example, as illustrated in FIGS. 11A-11C, the openings 662 and 663 exposing portions of the fins 220 and 230 are deepened as the openings 666 and 667, which in turn results in split the continuous fin 210 into discontinuous fins 221, 222 and 223 and split the continuous fin 230 (as shown in FIG. 9C) into discontinuous fins 231, 232 and 233 (as shown in FIG. 4B).

At operation 703, dielectric dummy gates are formed on the fins over the P-type well region. For example, as described with respect to FIGS. 12A-13C, dielectric dummy gates 310, 311, 312 and 313 are formed in the respective openings 665, 666, 667 and 668 and on the fins 221-223.

At operation 704, remaining poly gates are replaced with gate electrodes and isolation gates. For example, as described with respect to FIGS. 14A-14C, remaining poly gates 620-328 are selectively removed to form openings that expose the underlying fins, and the corresponding gate electrodes 250-254 and 300-303 are formed in the openings over the exposed portions of the underlying fins.

Figure 16:
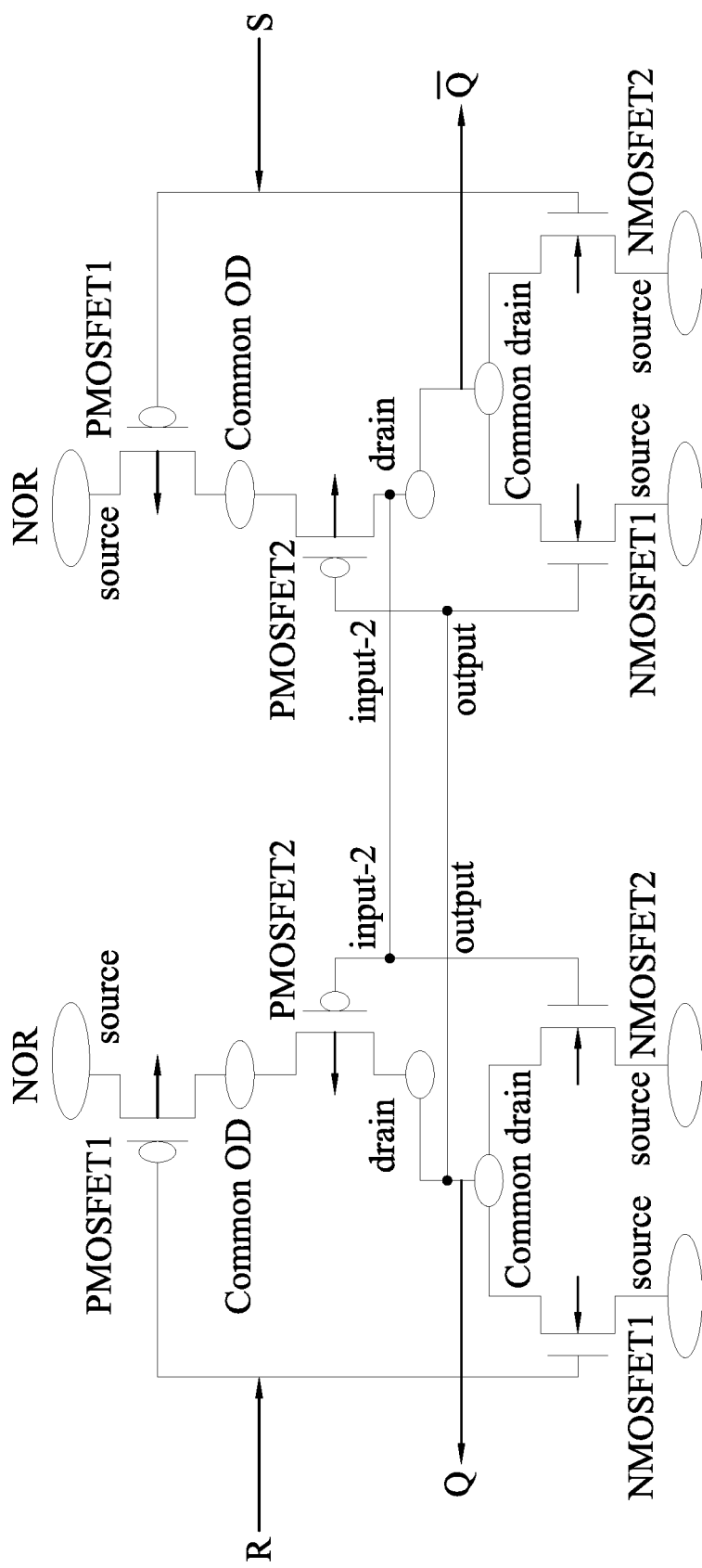
FIGS. 16 and 17 illustrate circuit schematics of various flip-flop cells according to some embodiments of the present disclosure.
Figure 17:
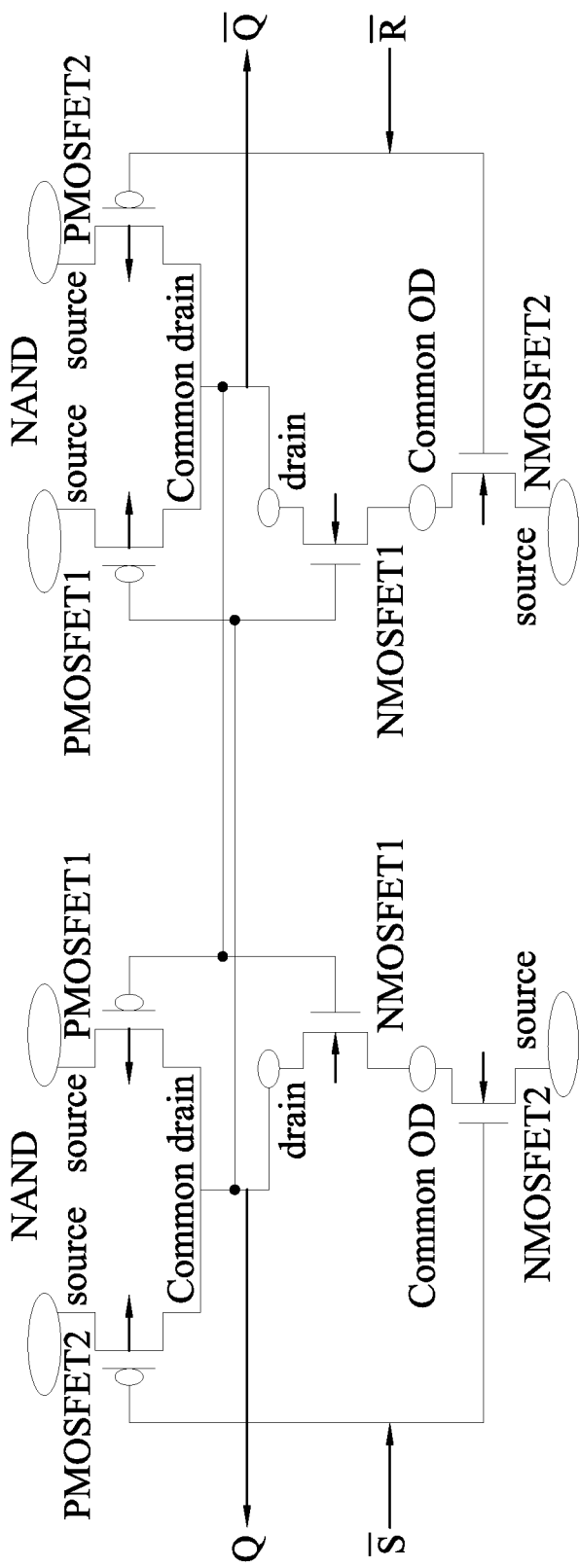

The inverter gate, NAND gate and NOR gate as discussed above are merely examples. The conductive isolation gates in the N-type well region and dielectric dummy gates in the P-type well region can be implemented in other circuit cells, such as flip-flop cells. As examples, a flip-flop cell shown in FIG. 16 is a set-reset (SR) NOR latch, where S and R stand for set and reset. The stored bit is present on the output marked Q. The NOR latch can include a pair of cross-coupled NOR gates, as illustrated in FIG. 4B. Moreover, another flip-flop cell shown in FIG. 17 is a SR NAND latch circuit which includes a pair of NAND gates, as illustrated in FIG. 4B.

In some embodiments, the layouts as shown in FIGS. 3 and 4B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the strain loss in the SiGe fin can be prevented because the SiGe fin is not broken. Another advantage is that additional gate cut process to break the isolation gate can be omitted, which in turn benefits the scaling down process of FinFETs. Another advantage is the dielectric dummy gate for electrically isolating abutted cells results in reduced leakage current as well as reduced parasitic capacitance. Another advantage is that the dielectric dummy gates and the gate electrodes in the P-type well region are spaced from each other by substantially the same spacing, and the isolation gates and the gate electrodes in the N-type well region are spaced from each other by substantially the same spacing as well, which in turn provides a regular arrangement of gates. Yet another advantage is that the dielectric dummy gate provides a dense gate environment, which in turn results in improved circuit density.

In some embodiments, a semiconductor device includes a germanium-containing fin, a germanium-free fin, and an isolation gate. The germanium-containing fin extends a first length along a first direction within an N-type well region. The germanium-free fin extends a second length along the first direction within a P-type well region bordering the N-type well region. The second length of the germanium-free fin is less than the first length of the germanium-containing fin. The isolation gate extends across the germanium-containing fin along a second direction substantially perpendicular to the first direction, and terminates prior to reaching the germanium-free fin.

In some embodiments, a semiconductor device includes an isolation gate and a dielectric dummy gate. The isolation gate extends along a first direction within an N-type well region. The dielectric dummy gate extends from a longitudinal end of the isolation gate along the first direction within a P-type well region bordering the N-type well region. A width of the isolation gate is comparable to a width of the dielectric dummy gate when viewed from above, and the widths are measured in a second direction substantially perpendicular to the first direction.

In some embodiments, a semiconductor device includes an STI structure, a germanium-containing fin, an isolation gate and a dielectric dummy gate. The STI structure spans over an N-type well region and a P-type well region neighboring the N-type well region. The germanium-containing fin is within the N-type well region and has an upper part protruding above the STI structure. The isolation gate wraps around three sides of the upper part of the germanium-containing fin. The dielectric dummy gate abuts the isolation gate. The dielectric dummy gate has an upper part over the STI structure and a lower part extending from the upper part of the dielectric dummy gate to the P-type well region through the STI structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a germanium-containing fin extending a first length along a first direction within an N-type well region;
    a germanium-free fin extending a second length along the first direction within a P-type well region bordering the N-type well region, the second length of the germanium-free fin being less than the first length of the germanium-containing fin; and
    an isolation gate extending across the germanium-containing fin along a second direction substantially perpendicular to the first direction, and terminating prior to reaching the germanium-free fin.

2. The semiconductor device of claim 1, wherein the first length of the germanium-containing fin is greater than three times the second length of the germanium-free fin.

3. The semiconductor device of claim 1, wherein the isolation gate has a longitudinal end on a boundary between the N-type well region and the P-type well region.

4. The semiconductor device of claim 1, wherein the germanium-containing fin has a channel region of a P-type transistor of an inverter, and the germanium-free fin has a channel region of an N-type transistor of the inverter.

5. The semiconductor device of claim 1, wherein the germanium-containing fin has a channel region of a P-type transistor of a NAND gate, and the germanium-free fin has a channel region of an N-type transistor of the NAND gate.

6. The semiconductor device of claim 1, wherein the germanium-containing fin has a channel region of a P-type transistor of a NOR gate, and the germanium-free fin has a channel region of an N-type transistor of the NOR gate.

7. The semiconductor device of claim 1, further comprising:
    a gate electrode extending across both the germanium-containing fin and the germanium-free fin.

8. The semiconductor device of claim 7, wherein a first portion of the gate electrode within the N-type well region is a gate of a P-type transistor of an inverter, and a second portion of the gate electrode within the P-type well region is a gate of an N-type transistor of the inverter.

9. The semiconductor device of claim 7, wherein a first portion of the gate electrode within the N-type well region is a gate of a P-type transistor of a NAND gate, and a second portion of the gate electrode within the P-type well region is a gate of an N-type transistor of the NAND gate.

10. The semiconductor device of claim 7, wherein a first portion of the gate electrode within the N-type well region is a gate of a P-type transistor of a NOR gate, and a second portion of the gate electrode within the P-type well region is a gate of an N-type transistor of the NOR gate.

11. A semiconductor device, comprising:
    an isolation gate extending along a first direction within an N-type well region; and
    a dielectric dummy gate extending from a longitudinal end of the isolation gate along the first direction within a P-type well region bordering the N-type well region, wherein a width of the isolation gate is comparable to a width of the dielectric dummy gate when viewed from above, and the widths are measured in a second direction substantially perpendicular to the first direction.

12. The semiconductor device of claim 11, further comprising:
    a gate electrode extending along the first direction from within the N-type well region to within the P-type well region, wherein a length of the gate electrode is comparable to a total length of the isolation gate and the dielectric dummy gate when viewed from above, and the lengths are measured in the first direction.

13. The semiconductor device of claim 11, wherein the isolation gate and the dielectric dummy gate define a cell boundary between an inverter cell and a NAND cell.

14. The semiconductor device of claim 13, further comprising:
    a first silicon fin extending along the second direction within the inverter cell;
    a second silicon fin extending along the second direction within the NAND cell and discontinuous from the first silicon fin; and
    a silicon germanium fin continuously extending along the second direction across the inverter cell and the NAND cell.

15. The semiconductor device of claim 11, wherein the isolation gate and the dielectric dummy gate define a cell boundary between a NAND cell and a NOR cell.

16. The semiconductor device of claim 15, further comprising:
    a first silicon fin extending along the second direction within the NAND cell;
    a second silicon fin extending along the second direction within the NOR cell and discontinuous from the first silicon fin; and
    a silicon germanium fin continuously extending along the second direction across the NAND cell and the NOR cell.

17. A semiconductor device, comprising:
- a shallow trench isolation (STI) structure spanning over an N-type well region and a P-type well region neighboring the N-type well region;
- a germanium-containing fin within the N-type well region and having an upper part protruding above the STI structure;
- an isolation gate wrapping around three sides of the upper part of the germanium-containing fin; and
- a dielectric dummy gate abutting the isolation gate, the dielectric dummy gate has an upper part over the STI structure and a lower part extending from the upper part of the dielectric dummy gate to the P-type well region through the STI structure.

18. The semiconductor device of claim 17, wherein the lower part of the dielectric dummy gate has a trapezoidal cross-section.

19. The semiconductor device of claim 17, wherein the STI structure extends laterally past an interface between the isolation gate and the dielectric dummy gate.

20. The semiconductor device of claim 17, further comprising:
- a gate dielectric layer under the isolation gate and having an end surface in contact with the upper part of the dielectric dummy gate.

* * * * *